(12) United States Patent
Kobashi

(10) Patent No.: US 7,843,028 B2
(45) Date of Patent: Nov. 30, 2010

(54) ELECTRO-OPTICAL DEVICE, SEMICONDUCTOR DEVICE, DISPLAY DEVICE, AND ELECTRONIC APPARATUS HAVING THE SAME

(75) Inventor: Yutaka Kobashi, Mizuho (JP)

(73) Assignee: Sony Corporation, Tokyo (JP)

( * ) Notice: Subject to any disclaimer, the term of this patent is extended or adjusted under 35 U.S.C. 154(b) by 248 days.

(21) Appl. No.: 12/010,822

(22) Filed: Jan. 30, 2008

(65) Prior Publication Data

US 2008/0204642 A1 Aug. 28, 2008

(30) Foreign Application Priority Data

Feb. 26, 2007 (JP) ............................. 2007-045051

(51) Int. Cl.
*H01L 33/00* (2010.01)
(52) U.S. Cl. .............................. 257/460; 257/E31.111
(58) Field of Classification Search ................. 250/206, 250/214 AL; 257/460, E31.111
See application file for complete search history.

(56) References Cited

U.S. PATENT DOCUMENTS

| 5,495,313 | A | 2/1996 | Kai |
| 5,831,693 | A | 11/1998 | McCartney, Jr. et al. |
| 7,405,387 | B2* | 7/2008 | Colvin et al. .......... 250/214 AL |
| 7,462,811 | B2* | 12/2008 | Cok et al. ............. 250/214 AL |
| 2006/0033729 | A1 | 2/2006 | Yoshida et al. |
| 2006/0077169 | A1 | 4/2006 | Fujikawa |
| 2008/0258046 | A1* | 10/2008 | Jang et al. ............. 250/214 AL |
| 2009/0027652 | A1* | 1/2009 | Chang et al. ............... 356/4.01 |

FOREIGN PATENT DOCUMENTS

| CN | 1760650 A | 4/2006 |
| JP | A-5-60611 | 3/1993 |
| JP | A-2006-243655 | 9/2006 |
| JP | A-2006-244407 | 9/2006 |

* cited by examiner

*Primary Examiner*—Allan R Wilson
(74) *Attorney, Agent, or Firm*—K&L Gates LLP

(57) ABSTRACT

An electro-optical device includes: a panel having a display area in which an electro-optical material is interposed between first and second substrates; and a light detection unit disposed on the first or second substrate to detect illuminance of ambient light of the panel, wherein the light detection unit performs a detecting operation plural times at a predetermined time interval, and wherein the predetermined time interval is set to be a value except for an integer multiple of 1/100 sec or 1/120 sec or a value close thereto.

14 Claims, 18 Drawing Sheets

VOLTAGE OF POWER SOURCE: VAC

ILLUMINANCE: LX

RST

OUT

VOLTAGE OF POWER SOURCE: VAC

ILLUMINANCE: LX

RST

OUT t=0    t=t0             t=40 msec   t=t0+40 msec
       =10.3 msec                   =50.3 msec

VOLTAGE OF POWER SOURCE: VAC

ILLUMINANCE: LX

RST

OUT

ELECTRO-OPTICAL DEVICE, SEMICONDUCTOR DEVICE, DISPLAY DEVICE, AND ELECTRONIC APPARATUS HAVING THE SAME

BACKGROUND

1. Technical Field

The present invention relates to an electro-optical device, a semiconductor device, a display device, and an electronic apparatus having the same.

2. Related Art

Recently, a technique for reducing power consumption and improving image quality by mounting a light sensor in a display device and measuring illuminance of external light to adjust brightness or the like has been developed (for example, U.S. Pat. No. 5,831,693). Examples of the light sensor include a thin-film transistor, a PIN diode, and a PN diode. It is desirable that a light-receiving unit is a silicon thin film and is manufactured by the same method by which the silicon thin film including a display switching element is manufactured in order not to increase manufacturing cost. At this time, external light refers to all types of environment light, that is, solar light, fluorescent light, incandescent light, LED light, or the like. Appropriate detection of illuminance thereof by use of the light sensor is required.

Solar light has uniform light intensity, but artificial light using AC power supply periodically blinks in many cases. In particular, in a case where glow discharge type fluorescent light is mainly used, the light blinks at 100 Hz or 120 Hz. Moreover, the light sensor is affected by such blinking light, and thus appropriate detection is not achieved.

SUMMARY

An advantage of some aspects of the invention is that it provides an electro-optical device capable of detecting illuminance with high precision even in an environment in which light blinks at 100 Hz or 120 Hz.

According to an aspect of the invention, there is provided an electro-optical device including: a panel (a liquid crystal panel 911 in embodiments) having a display area in which an electro-optical material (a nematic liquid crystal material 922 in the embodiments) is interposed between a first substrate (an active matrix substrate 101 in the embodiments) and a second substrate (a counter substrate 912 in the embodiments); and a light detection unit (a detection circuit 360 and a light-receiving sensor 350P in the embodiments) disposed on the first or second substrate to detect illuminance of ambient light of the panel, wherein the light detection unit performs a detecting operation plural times at a predetermined time interval (period TR of an RST signal), and wherein the predetermined time interval is set to be a value except for an integer multiple of $1/100$ second or $1/120$ second or a value close thereto. With such a configuration, the precision of the illuminance detection can be improved only by performing the small number of sampling operations for a short time even in the environment in which light blinks at 100 Hz or 120 Hz.

According to another aspect of the invention, there is provided a semiconductor device including: a light sensor (the light-receiving sensor 350P) disposed on a substrate to measure illuminance of external light around the substrate and a detection circuit (the detection circuit 360 in the embodiments) connected to the light sensor to perform an output corresponding to the illuminance of the external light, wherein the detection circuit performs an operation of detecting the illuminance of the external light plural times on the basis of an input from the light sensor, and wherein when it is assumed that a time interval between a first detecting operation and a second detecting operation subsequent to the first detecting operation is T1, the time interval T1 is set to be a value except for an integer multiple of $1/100$ second or $1/120$ second or a value close thereto. With such a configuration, the precision of the illuminance detection can be improved only by performing the small number of sampling operations for a short time even in the environment in which light blinks at 100 Hz or 120 Hz. More specifically, when it is assumed that n is an arbitrary integer, the time interval T1 may be set to be a (n+0.5) multiple of $1/100$ second, (n+0.5) multiple of $1/120$ second, or a value therebetween. The semiconductor device in which a value therebetween is set may further include a circuit (a central operational circuit 781 in the embodiments) that samples the output of the detection circuit plural times to perform a statistical process. With such a configuration, the precision can be improved by performing the sampling operation twice minimally.

In the semiconductor device with the above-described configuration, when it is assumed that a time interval between the second detecting operation and a third detecting operation subsequent to the second detecting operation is T2, the time interval T1 and the time interval T2 may be different from each other. In this way, the detection intervals are not set uniformly to cope with the blinking period of all external light.

In the semiconductor device with the above-described configuration, the light sensor may be an element which converts the illuminance of the external light into current, and the detection circuit may be a circuit which resets one end of a node connected to the light sensor to an initial potential every start of a detection period and which performs the detecting operation by detecting a variation in a potential of the node. Even when the output current from the light sensor is weak, the detection circuit can perform detection with high precision. However, since an interval of a uniform detection operation is necessary, the detection circuit is easily affected by the blinking external light. As a result, it is appropriate to apply the embodiment.

In the semiconductor device with the above-described configuration, the light sensor may be a PIN junction diode or a PN junction diode using a polysilicon thin film. Such a light sensor can be manufactured in the liquid crystal display device at low cost. However, since efficiency of thermoelectric current is poor, it is appropriate to apply the embodiments.

According to still another aspect of the invention, there are provided a display device including the semiconductor device with the above-described configuration and an electronic apparatus using the display device. Since the light sensor with good precision in all environments is included, it is possible to provide the electronic apparatus capable of adjusting image quality or brightness indoors, achieving good visibility, reducing power consumption, and allowing a battery to be driven for a long time. In addition, since the display device in which a frame period of display is an integer multiple of the time interval T1 is provided, it is easy to generate signals at low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention of an electro-optical device, a semiconductor device, a display device, and an electronic apparatus having the same will be described with reference to drawings.

First Embodiment

Figure 1:
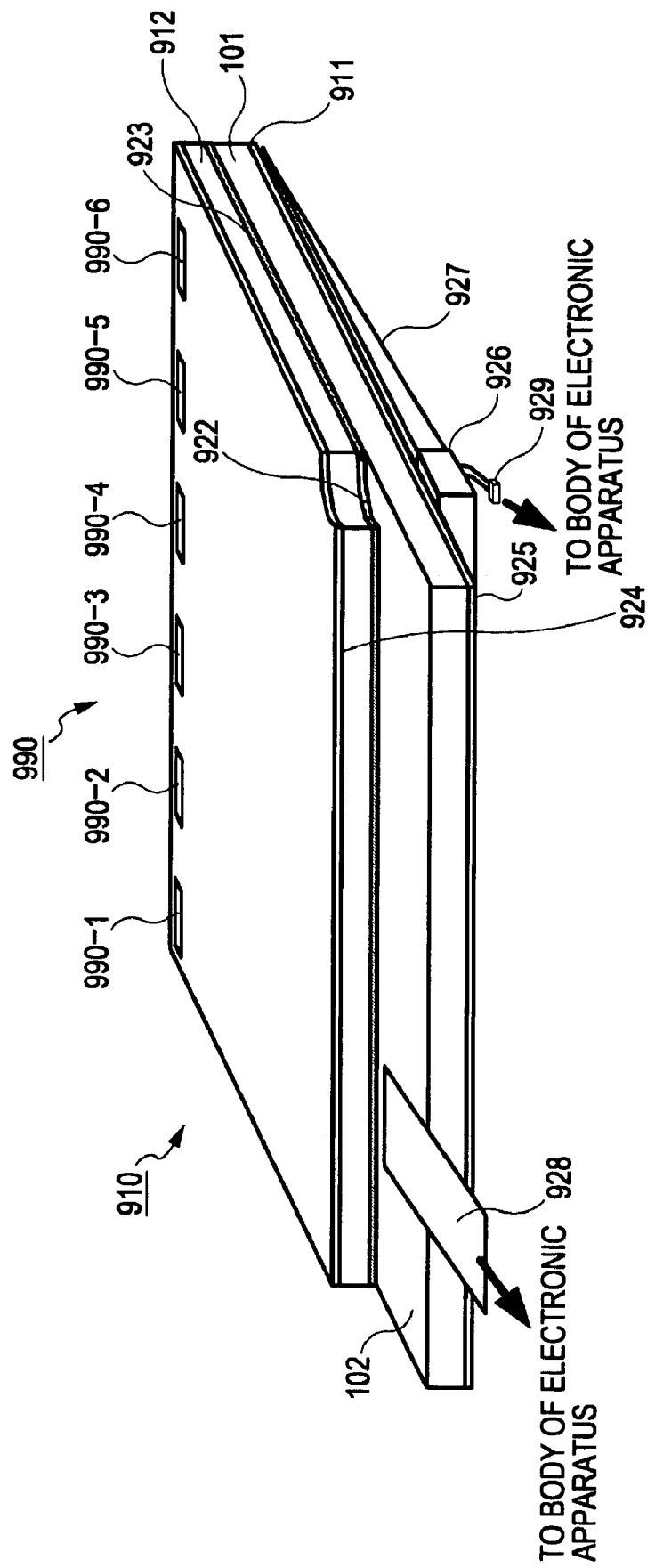
FIG. 1 is a perspective view illustrating a liquid crystal device according to a first embodiment of the invention.

FIG. 1 is a perspective view (partly sectional view) illustrating a configuration of a liquid crystal device 910 according to a first embodiment of the invention. The liquid crystal device 910 includes an active matrix substrate 101 and a counter substrate 912 bonded with a uniform interval therebetween a seal material 923 and also includes a liquid crystal panel 911 containing a nematic liquid crystal material 922.

An alignment material made of polyimide and the like (not shown) is applied on an active matrix substrate 101 and subjected to a rubbing process to form an alignment film. On the counter substrate 912, there are formed color filters (not shown) corresponding to pixels, a black matrix 940 formed of a low reflective and a low transmissive resin in order to prevent light leakage and improve contrast, and counter electrodes 930 formed of indium tin oxide (ITO) film, short-circuited with counter conductive portions 330-1 to 330-2 on the active matrix substrate 101, and supplied with a voltage. The alignment material formed of polyimide and the like is applied on a surface which comes in contact with the nematic liquid crystal material 922 and subjected to the rubbing process in a direction perpendicular to a direction of the rubbing process performed in the alignment film of the active matrix substrate 101.

A top polarizing plate 924 and a bottom polarizing plate 925 are disposed on the outer side of the counter substrate 912 and the outer side of the active matrix substrate 101, respectively. Moreover, the polarizing directions thereof are perpendicular (crossed Nichol state) to each other. A backlight unit 926 and a light guide plate 927 are disposed below the bottom polarizing plate 925. The backlight unit 926 radiates light toward the light guide plate 927. The light guide plate 927, which reflects and refracts light from the backlight unit 926 so as to be a surface light source perpendicular and uniform about the active matrix substrate 101, serves as a light source of the liquid crystal display device 910. The backlight unit 926 is a LED unit in the first embodiment, but may be a cold-cathode fluorescent lamp (CCFL). The backlight unit 926 connected to the body of an electronic apparatus through a connector 929 is supplied with a power supply. In the first embodiment, the power supply is appropriately adjusted so that the backlight unit 926 has a function of adjusting an amount of light thereof.

If necessary, the circumference may be covered with an exterior layer (not shown). Alternatively, protection glass or an acrylic plate may be attached to the top polarizing plate 924 or an optical correction film may be attached thereto in order to improve a viewing angle.

Light-receiving openings 990 of light sensors are formed on the outside of the liquid crystal display device 910. In addition, an extension portion 102 protruding from the counter substrate 912 extends from the active matrix substrate 101. A flexible printed circuit board (FPC) 928 is attached so as to be electrically connected to a signal input terminal 320 disposed in the extension portion 102. The flexible printed circuit board (FPC) 928 which is connected to the body of the electronic apparatus and necessary power supply is supplied with a control signal, and the like.

Six light-receiving openings 990-1 to 990-6 of the light sensors are formed on the liquid crystal display device 910. The light-receiving openings 990-1 to 990-6 are formed by partially removing a black matrix 940 on the counter electrodes 930 and external light is configured to reach the active matrix substrate 101. The circumference of the light-receiving openings 990-1 to 990-6 is formed so that the black matrix 940 on the counter electrodes 930 is not removed, and thus external light does not reach the active matrix substrate 101.

Figure 2:
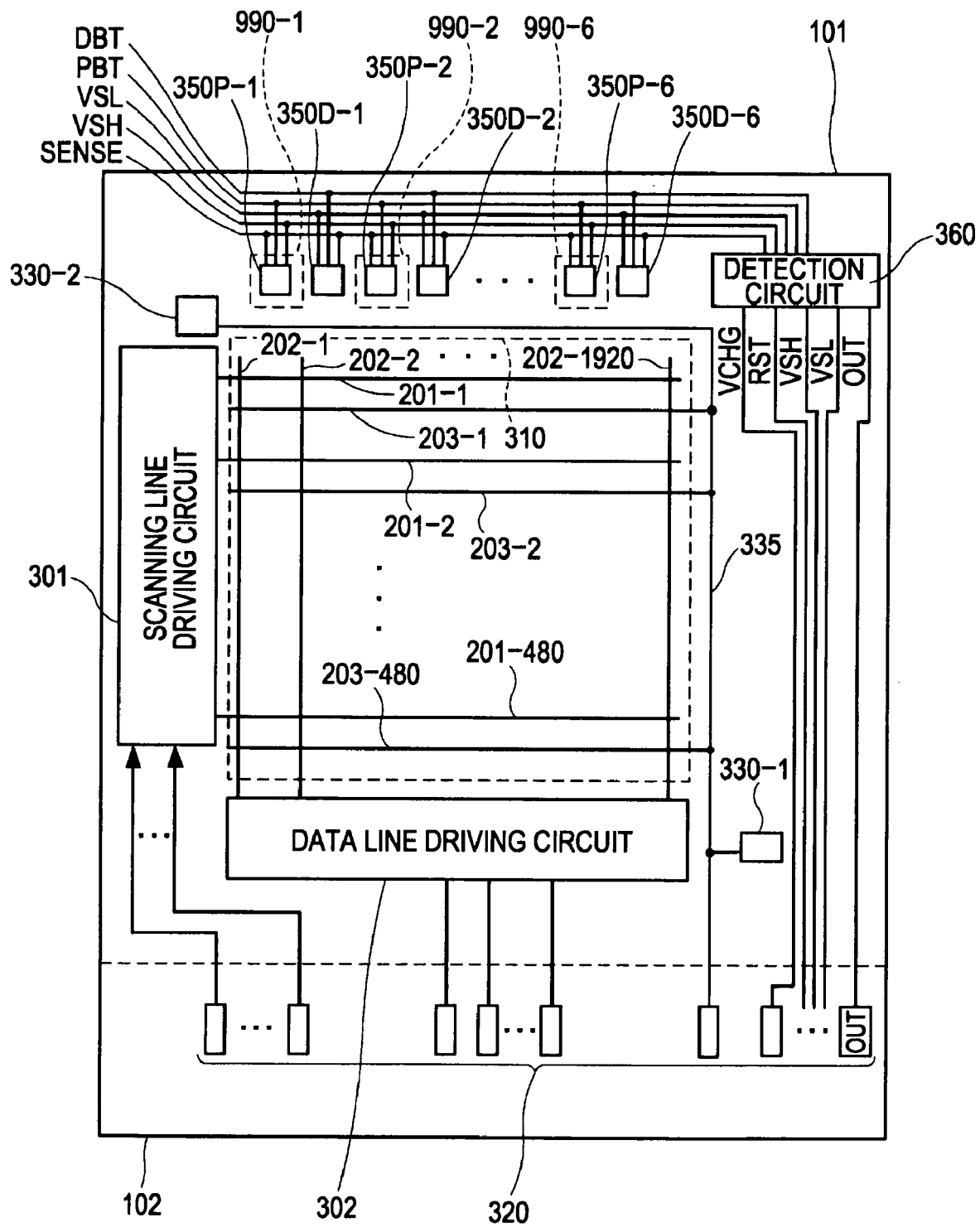
FIG. 2 is a diagram illustrating a configuration of an active matrix substrate according to the first embodiment of the invention.

FIG. 2 is a block diagram illustrating the active matrix substrate 101. On the active matrix substrate 101, 480 scanning lines 201-1 to 201-480 and 1920 data lines 202-1 to 202-1920 intersect each other, and 480 capacitor lines 203-1 to 203-480 are disposed parallel to the scanning lines 201-1 to 201-480. The capacitor lines 203-1 to 203-480 are short-circuited with each other and connected to a common potential line 335. Moreover, the capacitor lines 203-1 to 203-480 are connected to two counter conductive portion 330-1 and 330-2 to be supplied with an inversion signal of 0 V to 5 V from the signal input terminal 320 and a common potential, the inversion time of which is 47.6 μsec. The scanning lines 201-1 to 201-480 are connected to a scanning line driving circuit 301 and the data lines 202-1 to 202-1920 are connected to a data line driving circuit 302, which are each appropriately driven. A signal necessary for a drive is supplied from the signal input terminal 320 to the scanning line driving circuit 301 and the data line driving circuit 302. The signal input terminal 320 is disposed on the extension portion 102. On the other hand, the scanning line driving circuit 301 and the data line driving circuit 302 are disposed in an area overlapping the counter substrate 912, that is, the area other than the extension portion 102. The scanning line driving circuit 301 and the data line driving circuit 302 are formed by integrating polysilicon thin-film transistors on the active matrix substrate by use of a system on glass (SOG) display technology, which integrates a circuit function necessary for drive on the active matrix substrate by a low-temperature polysilicon TFT process. The scanning line driving circuit 301 and the data line driving circuit 302 which are manufactured by the same process as pixel switching element 401-$n$-$m$, as described below, constitute a so-called driving circuit mounted-in type liquid crystal display device.

Six light-receiving sensors 350P-1 to 350P-6 are formed in the regions overlapping the six light-receiving openings 990-1 to 990-6, respectively, and six light-shielded sensors 350D-1 to 350D-6 are alternated therewith. The light-receiving sensors 350P-1 to 350-6 and the light-shielded sensors 350D-1 to 350D-6 are also formed on the active matrix substrate by use of the system on glass (SOG) display technology. It is possible to reduce manufacturing cost by employing the same manufacturing process as that of the pixel switching element 401-$n$-$m$.

The light-receiving sensors 350P-1 to 350P-6 overlap the light-receiving openings 990-1 to 990-6 in plan view and external light reaches the sensors. In contrast, the light-shielded sensors 350D-1 to 350D-6 do not overlap the light-receiving openings 990-1 to 990-6 in plan view and external light is absorbed by the black matrix 940 on the counter electrodes 930, and thus little external light reaches the sensors. The light-receiving sensors 350P-1 to 350P-6 are connected to wiring lines PBT, VSH, and SENSE. In addition, the light-shielded sensors 350D-1 to 350D-6 are connected to wiring lines DBT, VSL, and SENSE. The wiring lines PBT, VSH, SENSE, DBT, and VSL are connected to a detection circuit 360. The detection circuit 360 performs a conversion to binary output signals OUT of a pulse length corresponding to an output analog current which has a correlation with the outside illuminance from the light-receiving sensors 350P-1 to 350P-6 and the light-shielded sensors 350D-1 to 350D-6, so as to output them to the signal input terminal 320. In addition, the wiring lines VCHG, RST, VSL, and VSH are also supplied to the detection circuit 360 through the signal input terminal 320.

As described in detail below, the light-receiving sensors 350P-1 to 350P-6 overlap backlight light-shielded electrodes 611P-1 to 611P-6 in plan view. In addition, the light-shielded sensors 350D-1 to 350D-6 overlap backlight light-shielded electrodes 611D-1 to 611D-6 in plan view. Since light from each backlight unit is blocked, detection precision of the external light is not reduced due to the light from each backlight unit. In addition, the light-receiving sensors 350P-1 to 350P-6 overlap transparent electrodes 612P-1 to 612P-6 and the light-shielded sensors 350D-1 to 350D-6 also overlap the transparent electrodes 612D-1 to 612D-6. Accordingly, the detection precision is not reduced due to electronic noise generated during drive of a display area 310. With such a configuration, even when the light-receiving sensors 350P-1 to 350P-6 and light-shielded sensors 350D-1 to 350D-6 are disposed close to the display area 310, the detection precision is not reduced. Accordingly, it is possible to realize a better design, compared with a known product. In the first embodiment, the size of the light-receiving openings 990-1 to 990-6, that is, the size of the opening of the black matrix 940 on each of the light-receiving sensors 350P-1 to 350P-6 is set to be 10 mm×0.3 mm. In addition, the gap from the end of the light-receiving openings 990-1 to 990-6 to the display area 310 is set to be 0.5 mm.

Figure 3:
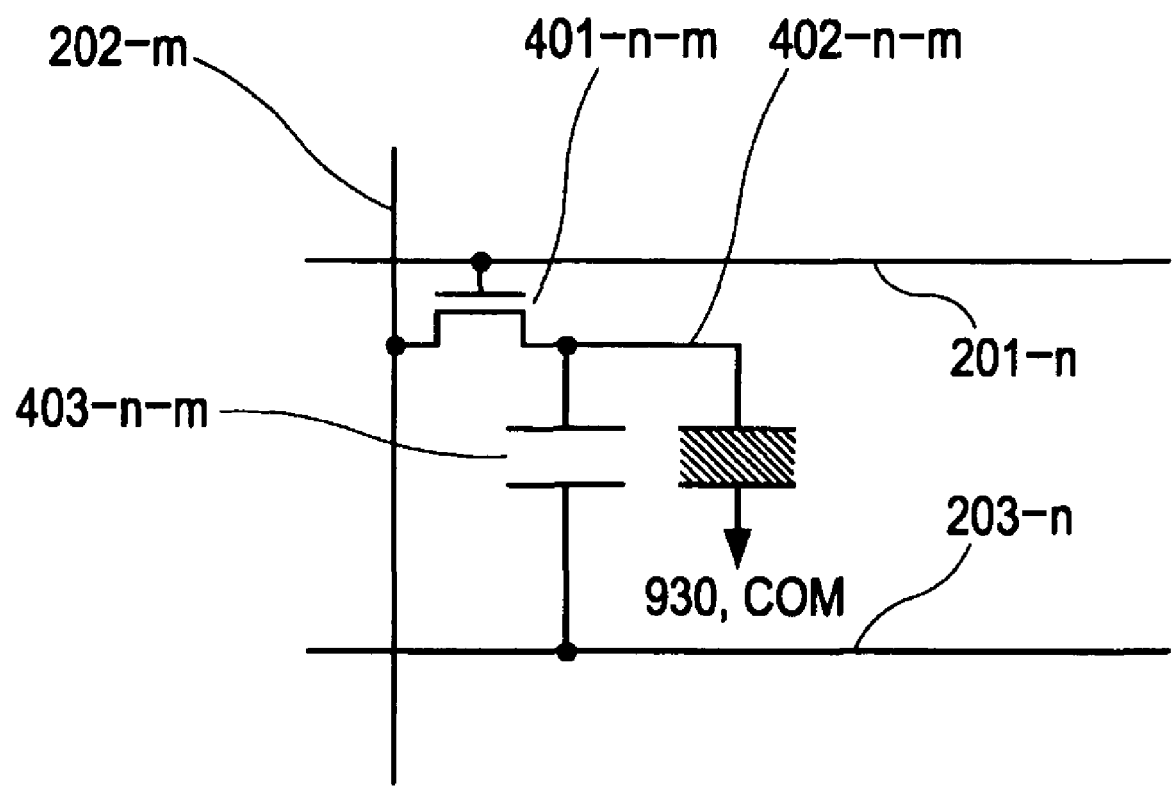
FIG. 3 is a diagram illustrating a circuit of each pixel in the active matrix substrate according to the first embodiment of the invention.

FIG. 3 is a diagram illustrating a circuit in the vicinity of the intersection of an m-th data line 202-$m$ and an n-th scanning line 201-$n$ in the display area 310 indicated by dash lines shown in FIG. 2. A pixel switching element 401-$n$-$m$ constituted by an N-channel electric-field-effect polysilicon thin-film transistor is formed at the intersection of the scanning line 201-$n$ and the data line 202-$m$. In addition, a gate electrode is connected to the scanning line 201-$n$ and a source drain electrode is connected to the data line 202-$m$ and a pixel electrode 402-$n$-$m$. The pixel electrode 402-$n$-$m$ and an electrode short-circuited to the same potential form a capacitor line 203-$n$ and a supplementary capacitor 403-$n$-$m$ and also form a counter electrode 930 (common electrode) and the capacitor, the liquid crystal element interposed therebetween when the liquid crystal display device is assembled.

The frame rate in the first embodiment is 43.6 Hz. That is, the pixel switching elements 401-$n$-$m$ is selected every 22.9 msec by the scanning line driving circuit 301 and a signal, the polarity of which is inversed, is alternately applied to each of the pixel electrodes 402-$n$-$m$ once every 22.9 msec.

Figure 4:
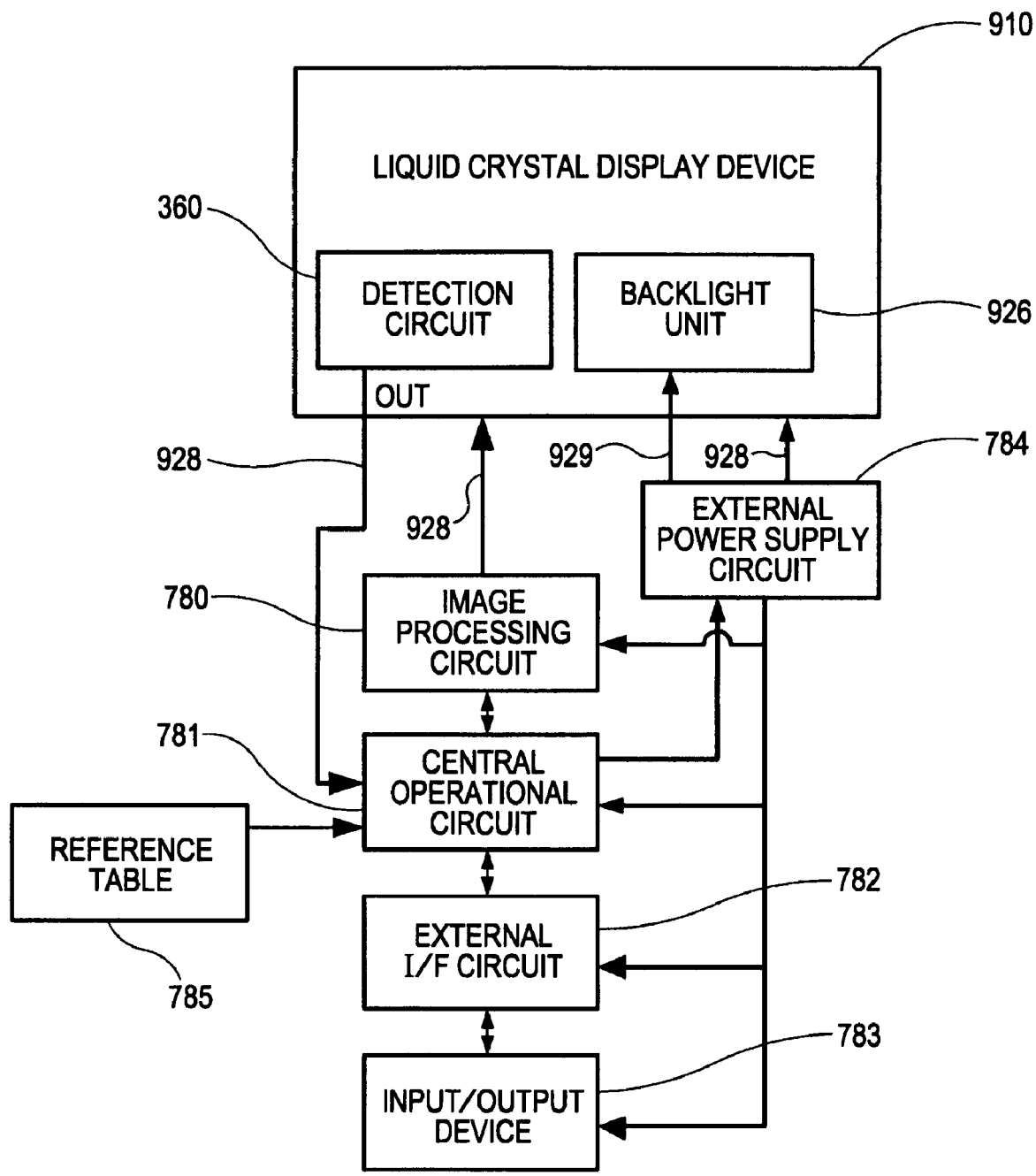
FIG. 4 is a block diagram illustrating an electronic apparatus according to the first embodiment of the invention.

FIG. 4 is a block diagram illustrating a specific configuration of an electronic apparatus according to the first embodiment. The liquid crystal display device 910 is the liquid crystal display device shown in FIG. 1. An external power supply circuit 784 and an image processing circuit 780 supply a necessary signal and a power supply to the liquid crystal display device 910 through the flexible printed circuit board (FPC) 928 and the connector 929. The central operational circuit 781 acquires input data from an input/output device 783 through an external I/F circuit 782. Examples of the input/output device 783 include a keyboard, a mouse, a track ball, an LED, a speaker, and an antenna. The central operational circuit 781 performs various types of computational processing on the basis of data from outside and transmits the results to the image processing circuit 780 or the external I/F circuit 782 as commands. The image processing circuit 780 updates image information on the basis of the commands from the central operational circuit 781 and changes the signals from the liquid crystal display device 910 to change display images of the liquid crystal display device 910. Binary output signals OUT from the detection circuit 360 of the liquid crystal display device 910 are input to the central operational circuit 781 through the flexible printed circuit board (FPC) 928, and then the central operational circuit 781 converts pulse lengths of the binary output signals OUT into corresponding binary vales. Subsequently, the central operational circuit 781 accesses a reference table 785 formed of an electronically erasable and programmable read-only memory (EEPROM), re-converts the converted binary values into appropriate values corresponding to a voltage of the backlight unit 926, and then transmits them to the external power supply circuit 784. The external power supply circuit 784 supplies a voltage corresponding to the transmitted values to the backlight unit 926 of the liquid crystal display device 910 through the connector 929. Since brightness of the backlight unit 926 varies in accordance with the voltage supplied from the external power supply circuit 784, brightness also varies at the time white color is displayed on the entire liquid crystal display device 910. Examples of the electronic apparatuses include a monitor, a TV, a laptop computer, a PDA, a digital camera, a cellular phone, a portable photo viewer, a portable video player, a portable DVD player, and a portable audio player.

In the first embodiment, the brightness of the backlight unit 926 is controlled by the central operational circuit 781 in the electronic apparatus. However, for example, a driver IC and the EEPROM may be included in the liquid crystal display device 910. In addition, the driver IC may have a function of converting the binary output signals OUT into discrete values, a function of re-conversion with reference to the EEPROM, a function of adjusting the output voltage to the backlight unit 926. Moreover, without using the reference table, the discrete values may be re-converted into values corresponding to the voltage of the backlight unit 926 by performing numeric computation.

Figure 5:
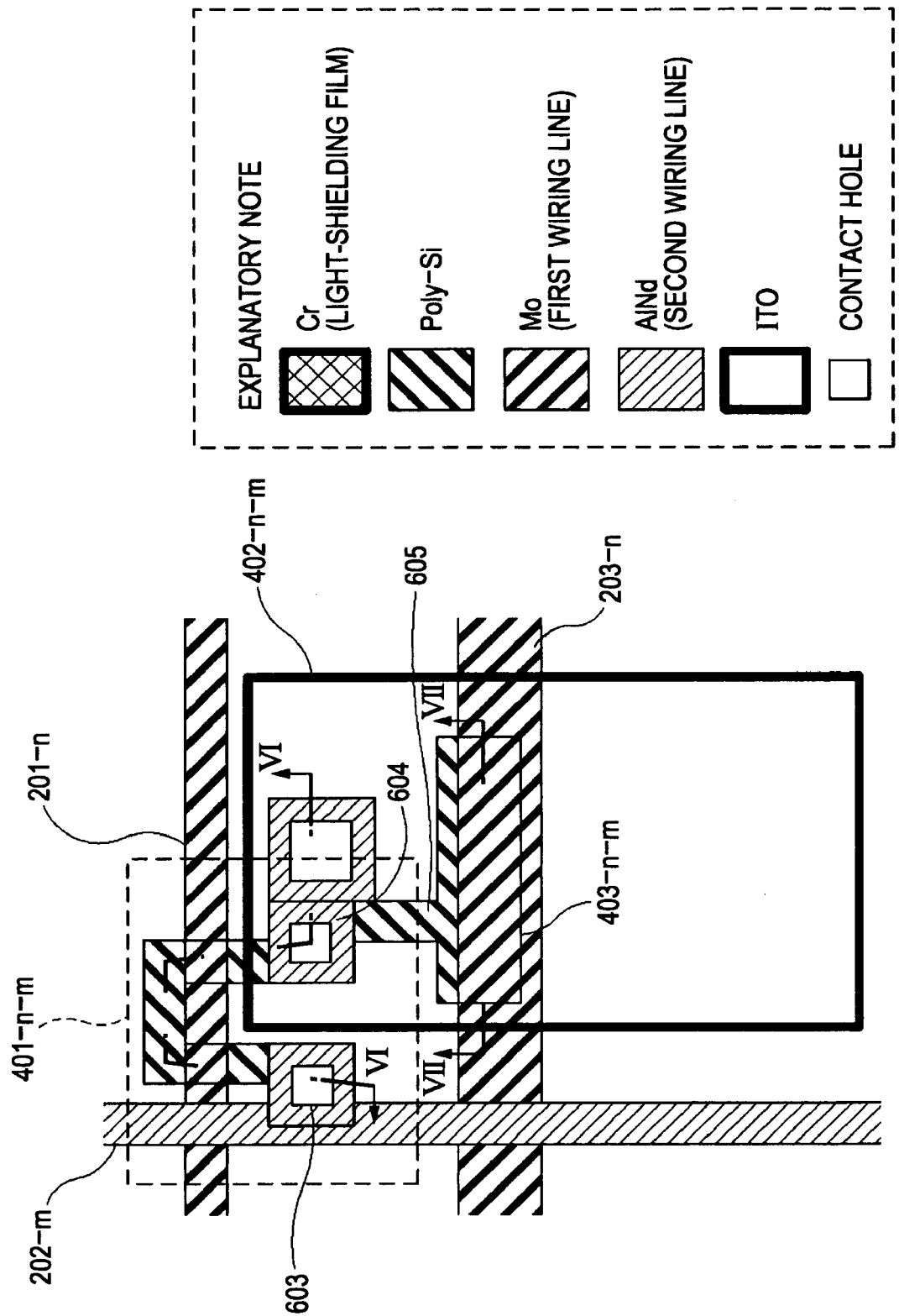
FIG. 5 is a top view illustrating a pixel unit of the active matrix substrate according to the first embodiment of the invention.

FIG. 5 is a top view illustrating an actual configuration of the circuit of the pixel display area shown in FIG. 3. As shown in an explanatory note in FIG. 5, different shaded regions indicate different material wiring lines and identical shaded regions indicate identical material wiring lines. A five-layer thin film in which a chrome (Cr) thin film, a polysilicon (poly-Si) thin film, a molybdenum (Mo) thin film, an aluminum neodymium (ALNd) alloy thin film, and an indium tin oxide (ITO) thin film are laminated is formed. In addition, one of an oxide silicon film, a nitride silicon film, and an organic insulation film or an insulation film formed by laminating them is formed between the layers. Specifically, the thickness of the chrome thin film is 100 nm, the thickness of the polysilicon thin film is 50 nm, the thickness of the molybdenum thin film is 200 nm, the thickness of the aluminum neodymium alloy thin film is 500 nm, and the thickness of the indium tin oxide thin film is 100 nm. A ground insulating film in which the nitride silicon film of 100 nm thickness and the oxide silicon film of 100 nm thickness are laminated is formed between the chrome (Cr) thin film and the polysilicon (Poly-Si) thin film. A gate insulating film formed by the oxide silicon film of 100 nm thickness is formed between the polysilicon (Poly-Si) thin film and the molybdenum (Mo) thin film. An interlayer insulating layer in which the nitride silicon film of 200 nm thickness and the oxide silicon film of 500 nm thickness are laminated is formed between the molybdenum (Mo) thin film and the aluminum neodymium (ALNd) alloy thin film. A protection insulating film in which the nitride silicon film of 200 nm thickness and the organic planarizing layer of 1 μm average thickness is formed between the aluminum neodymium (ALNd) alloy thin film and the indium tin oxide (ITO) thin film and insulates wiring lines. Moreover, contact holes are opened at appropriate positions to be connected to each other. A pattern of the chrome (Cr) thin film is not shown in FIG. 5.

As shown in FIG. 5, the data line 202-*m* is formed of the aluminum neodymium (ALNd) alloy thin film and connected to a source electrode of the pixel switching element 401-*n*-*m* through the contact hole. The scanning line 201-*n* is formed of the molybdenum (Mo) thin film and also serves as a gate electrode of the pixel switching element 401-*n*-*m*. The capacitor line 203-*n* is made of the same wiring material as that of the scanning line 201-*n*. The pixel electrode 402-*n*-*m* is formed of the indium tin oxide thin film and connected to a drain electrode of the pixel switching element 401-*n*-*m* through the contact hole. The drain of the pixel switching element 401-*n*-*m* is also connected to a capacitor electrode 605 formed of an n+ type polysilicon thin film doped with high-concentration phosphorus and overlaps the capacitor line 203-*n* in plan view to configure a capacitor 403-*n*-*m*.

Figure 6:
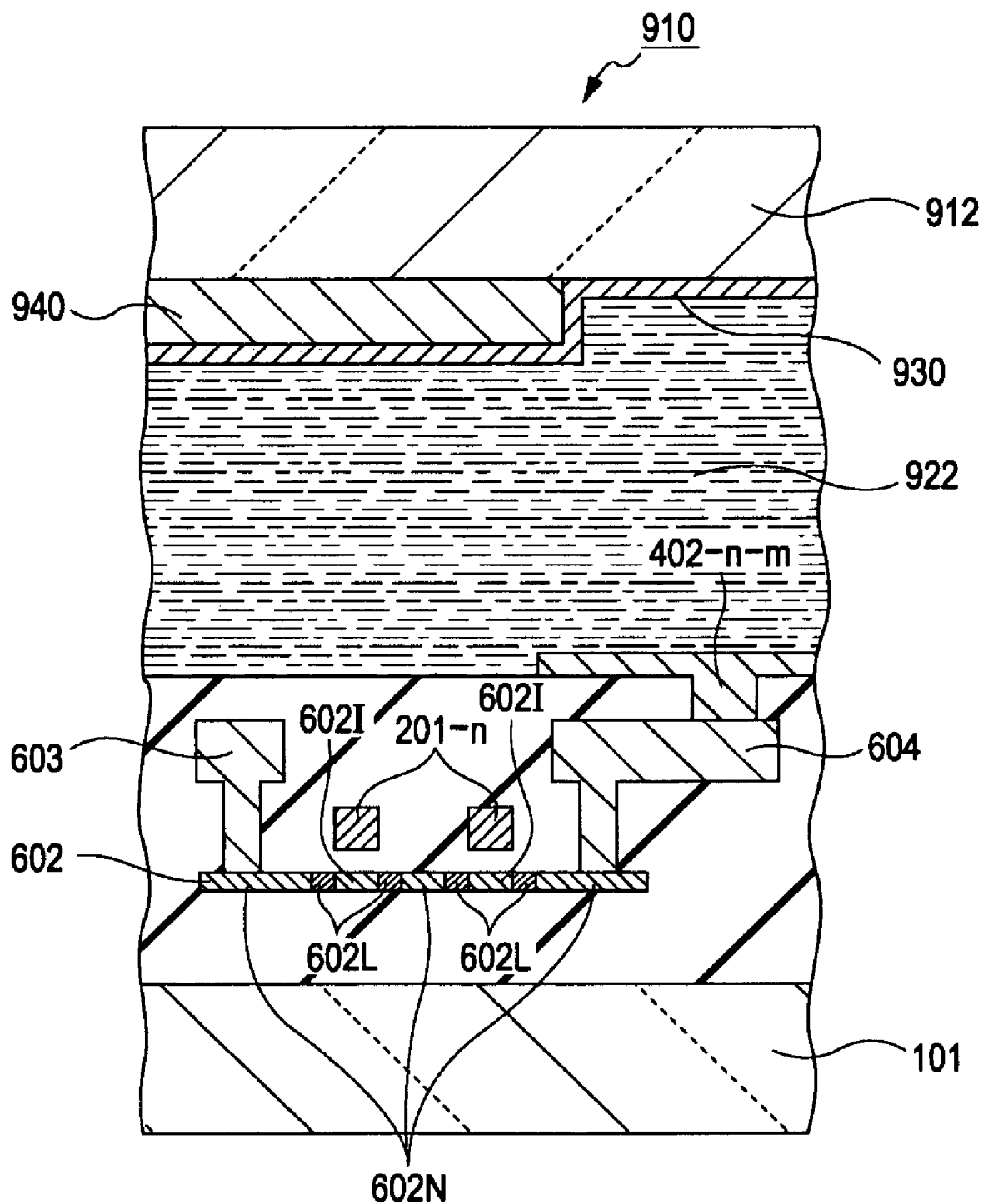
FIG. 6 is a sectional view illustrating the pixel unit taken along the line VI-VI shown in FIG. 5.

FIG. 6 is a diagram illustrating a configuration of a partial sectional surface of the liquid crystal display device 910 taken along the line VI-VI shown in FIG. 5 in order to describe the configuration of the pixel switching element 401-*n*-*m*. The scales used are not uniform to allow for easy viewing of the drawing. The active matrix substrate 101 is an insulating substrate of 0.6 nm made of alkali-free glass. A silicon island 602 formed of the polysilicon film is disposed on the active matrix substrate 101 through the ground insulating film in which the nitride silicon film of 200 nm thickness and the oxide silicon film of 300 nm thickness are laminated. The scanning lines 201-*n* are above the silicon island 602, the above-described gate insulating film being interposed therebetween. In regions which do not overlap the scanning lines 201-*n*, the silicon island 602 is an intrinsic semiconductor region 602I in which phosphorus ions are not applied at all or are applied at a considerably low concentration. In addition, the silicon island 602 has a lightly doped drain configuration where there are n− regions 602L, the sheet resistance of which is about 20 kΩ and in which the phosphorus ions are doped at a low concentration on the right and left sides, and n+ regions 602N, the sheet resistance of which is about 1 kΩ and in which the phosphorus ions are doped at a high concentration again on the right and left sides. The n+ regions 602N on the right and left sides are connected to the source electrode 603 and the drain electrode 604 through the contact holes which are formed in the interlayer insulating film. In addition, the source electrode 603 and the drain electrode 604 are connected to the data line 202-*m* and the pixel electrode 402-*n*-*m* formed on a planarized insulating film. A nematic liquid crystal material 922 exists between the pixel electrode 402-*n*-*m* and the counter electrode 930 on the counter substrate 912. The black matrix 940 is formed on the counter substrate 912 so as to partially overlap the pixel electrode 402-*n*-*m*. A problem arises in that light leakage of the pixel switching element 401-*n*-*m* may occur. To solve this problem, a light-shield layer formed of a chrome film may be formed below the silicon island 602. In the first embodiment, light leakage is not of concern and if such a structure is formed, mobility of the pixel switching element 401-*n*-*m* deteriorates. Accordingly, the chrome film below the silicon island 602 is configured not to be formed.

Figure 7:
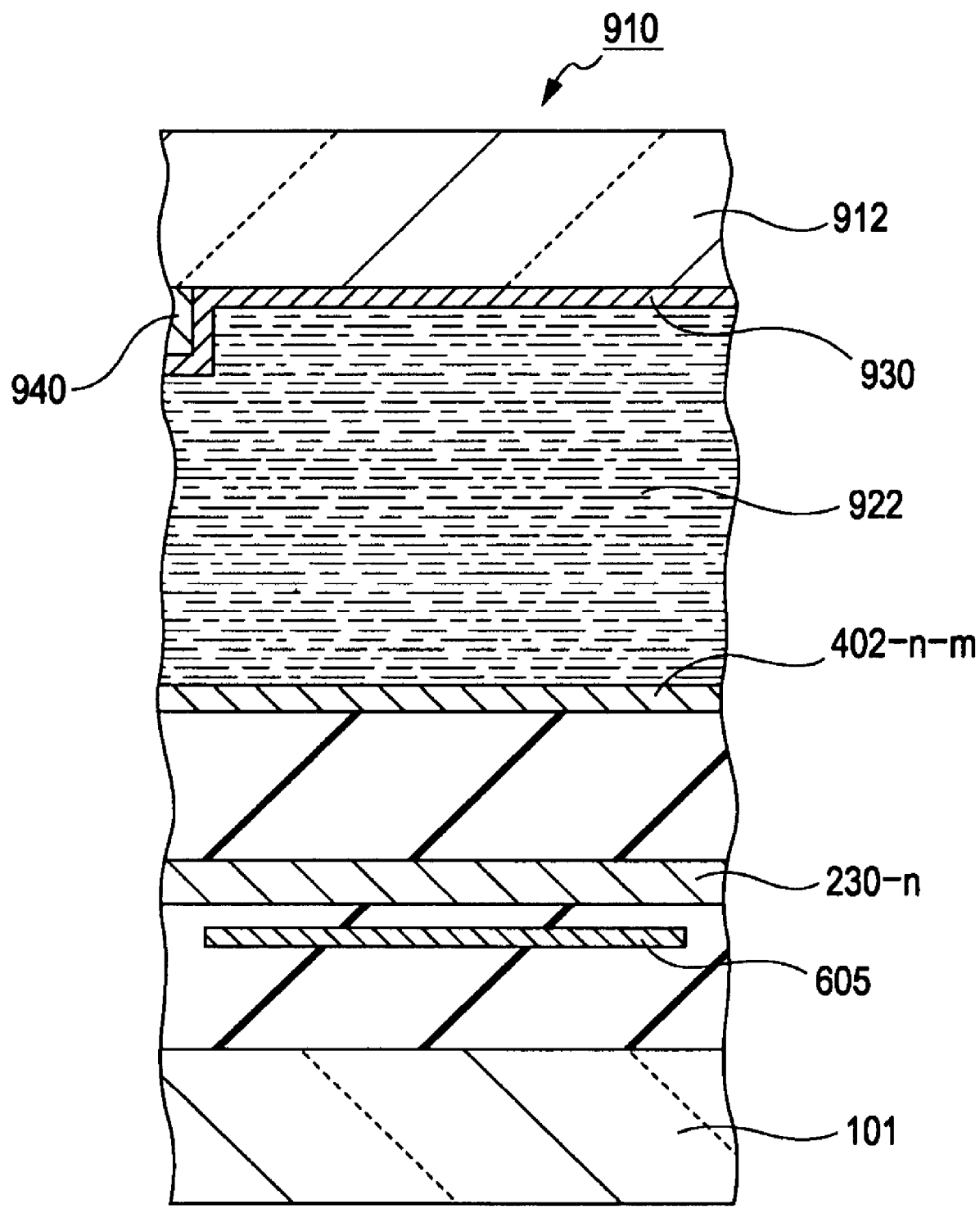
FIG. 7 is a sectional view illustrating the pixel unit taken along the line VII-VII shown in FIG. 5.

FIG. 7 is a sectional view illustrating a part of the liquid crystal display device 910 taken along the line VII-VII shown in FIG. 5 in order to describe a configuration of the supplementary capacitor 403-*n*-*m*. A storage capacitor is formed by interposing an insulating film between the capacitor line 203-*n* and the capacitor electrode 605 connected to the drain electrode 604.

Figure 8:
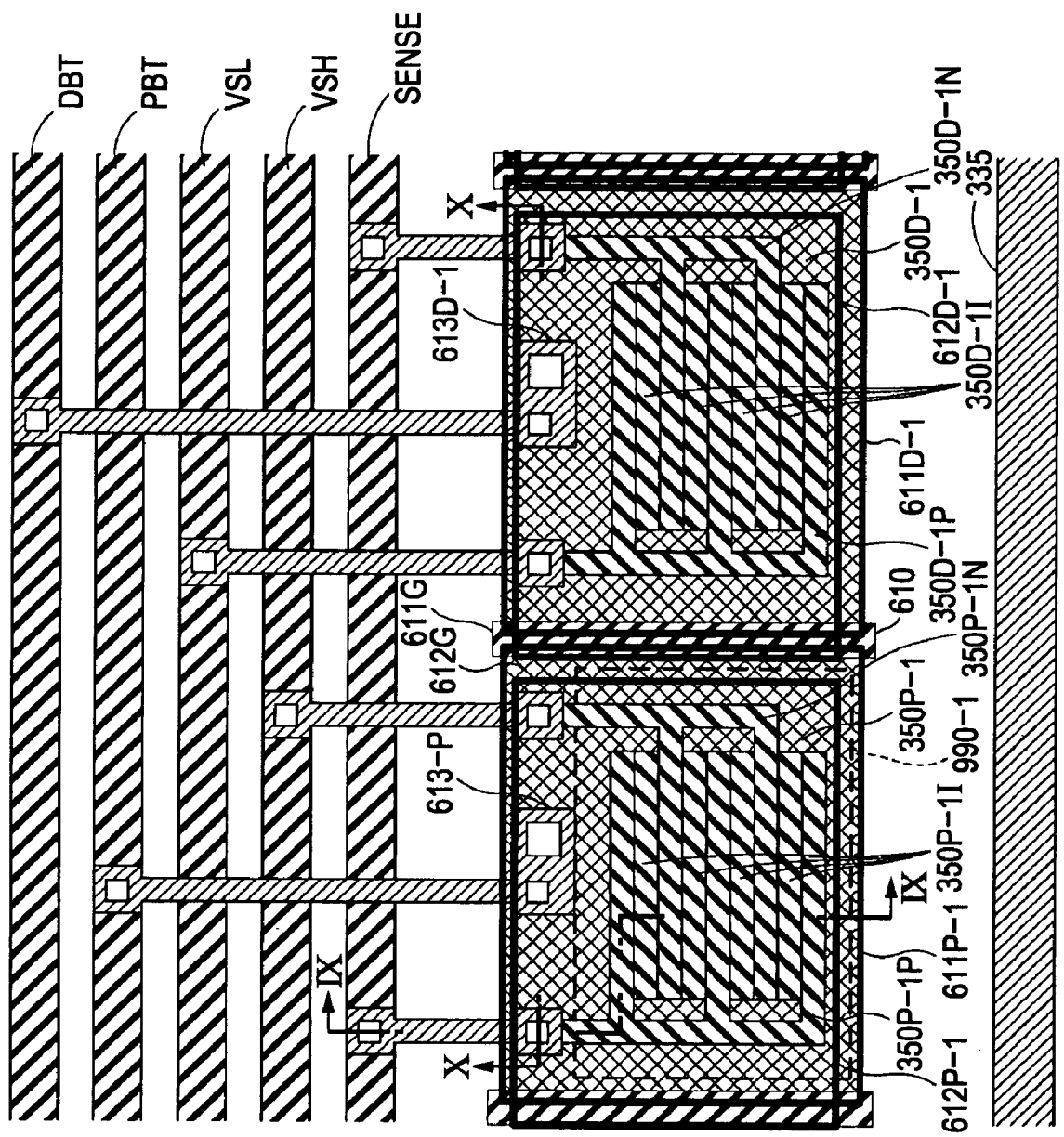
FIG. 8 is a top view illustrating a light-receiving sensor and a light-shielded sensor according to the first embodiment of the invention.

FIG. 8 is an enlarged top view illustrating the vicinity of the light-receiving sensor 350P-1 (first light sensor) and the light-shielded sensor 350D-1 (second light sensor). The scale used is not uniform to allow for easy viewings of the drawing. In addition, the explanatory note is the same as that shown in FIG. 5. The light-receiving sensor 350P-1, which overlaps the light-receiving opening 990-1 indicated by a bold dotted line in plan view, is configured so that external light reaches it. The light-receiving sensor 350P-1 is constituted by four isolated light-receiving portions 350P-1I, an anode region 350P-1P connected to the wiring line SENSE adjacent to the light-receiving portions 350P-1I, and a cathode region 350P-1N connected to the wiring line VSH. The light-receiving sensor 350P-1I, the anode region 350P-1P, and the cathode region 350P-1N are all formed in a manner where the constituent polysilicon thin-film islands are identical to one another except for differences in dopant concentrations thereamong. The anode region 350P-1P is doped with a relatively high concentration of boron ions, the cathode region 350P-N is doped with a relatively high concentration of phosphorus ions, and the light-receiving portions 350P-1I have a very low concentration of boron ions. The widths of the anode region 350P-1P, the cathode region 350P-1N, the light-receiving portions 350P-1I are each 10 µm. The lengths of the light-receiving portions 350P-1I are each 1000 µm. In this way, the light-receiving sensor 350P-1 is formed of a plurality of PIN junction diodes connected in parallel to each other. A common potential wiring line 335 is disposed close to the display area 310 of the light-receiving sensor 350P-1 and the light-shielded sensor 350D-1. However, in the first embodiment, the common potential wiring line 335 is not connected to the light-receiving sensor 350P-1 and the light-shielded sensor 350D-1, and is rather disposed separately by 100 µm in order to eliminate the effect of electronic noise.

The light-shielded sensor 350D-1 is constituted by four isolated light-receiving portions 350D-1I, an anode region 350D-1P connected to the wiring line VSL adjacent to the light-receiving portions 350D-1I, and a cathode region 350D-1N connected to the wiring line SENSE. The light-receiving sensor 350P-1 has the same configuration as that of the light-shielded sensor 350D-1 except that the wiring lines to which the cathodes and the anodes are connected are different and the light-shielded sensor 350D-1 does not overlap the light-receiving opening 990-1 in plan view, and thus more detailed description will be omitted. Moreover, the disposition position of the light-receiving sensors 350P-2 to 350P-5 is different from that of the light-receiving sensor 350P-1 and the disposition position of the light-shielded sensors 350D-2 to 350D-5 is different from that of the light-shielded sensor 350D-1, and other configurations are the same. Accordingly, the description thereof will be omitted.

Figure 9:
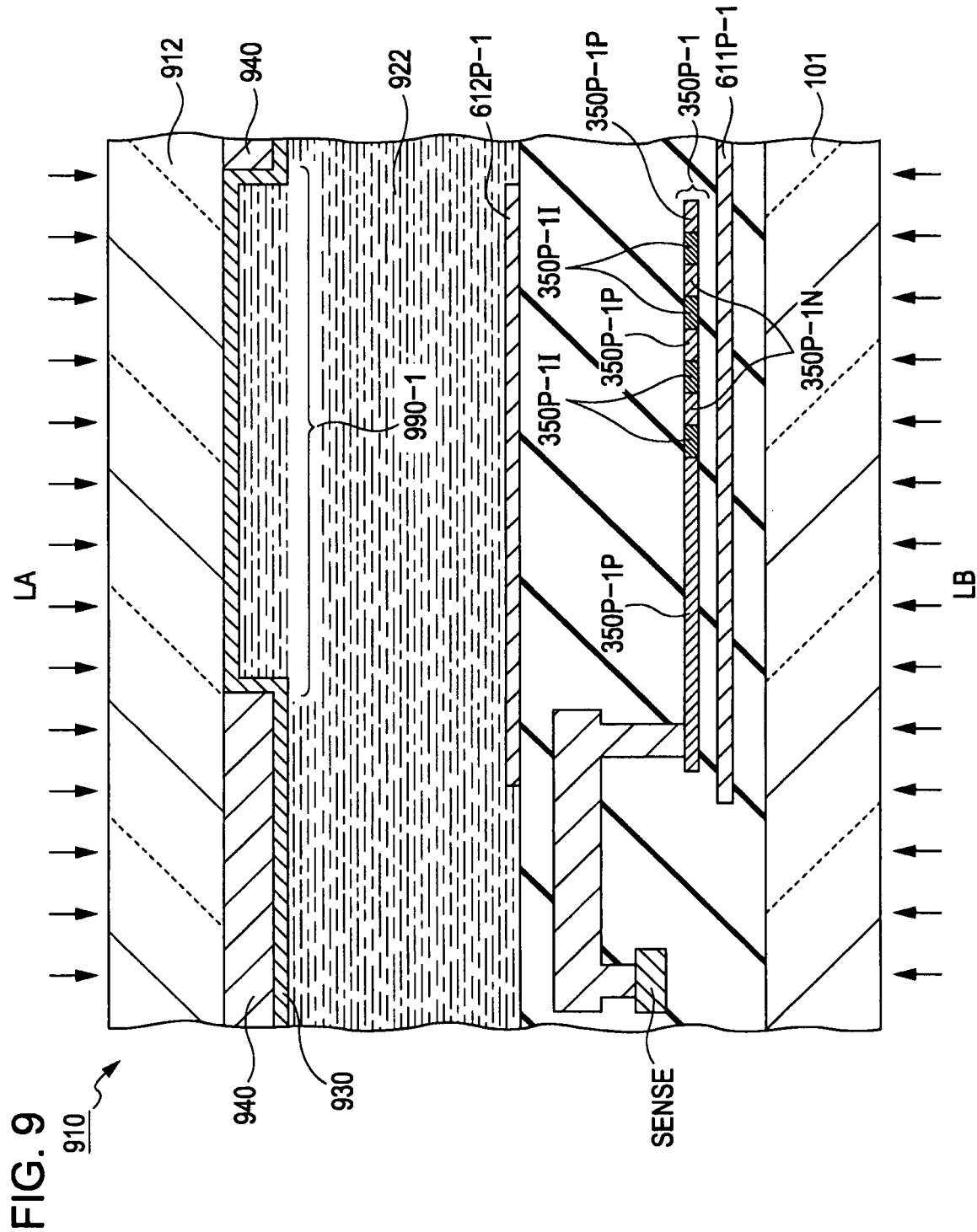
FIG. 9 is a sectional view taken along the line IX-IX shown in FIG. 8.

FIG. 9 is a sectional view illustrating a part of the liquid crystal display device 910 taken along the line IX-IX shown in FIG. 8 in order to describe a configuration of the light-receiving sensor 350P-1. A backlight light-shielded electrode 611P-1 (first light-shielded electrode) is disposed on the active matrix substrate 101 through the ground insulating film and the light-receiving sensor 350P-1 formed of polysilicon thin film is disposed on the backlight light-shielded electrode 611P-1, a gate insulating film being interposed therebetween. As described above, the light-receiving sensor 350P-1 is constituted by the four isolated light-receiving portions 350P-1I, an anode region 350P-1P connected to the wiring line SENSE adjacent to the light-receiving portions 350P-1I, and a cathode region 350P-1N connected to the wiring line VSL. A transparent electrode 612P-1 (first transparent electrode) made of indium tin oxide (ITO) is disposed above the light-receiving sensor 350P-1 through the interlay insulating film and a planarized insulating film and serves as an electric field shield for the light-receiving portions 350-1I.

The nematic liquid crystal material 922 is sealed above the transparent electrode 612P-1 and the counter electrode 930 is disposed on the counter substrate 912. It is possible to arrange the seal material 923 in accordance with the disposition position of the light-receiving sensor 350P-1, rather than in accordance with the nematic liquid crystal material 922. The light-receiving opening 990-1 is formed by partially removing the black matrix 940 on the counter substrate 912. There is no light-receiving opening on the light-shielded sensor 350D-1. Accordingly, the black matrix 940 is not removed.

External light LA radiates from the upper side of the counter substrate 912, while light (backlight light LB) from the backlight unit 926 radiates from the lower side of the active matrix substrate 101.

Even though not used in the first embodiment, an optical correction layer may be inserted into the light-receiving opening 990-1. For example, one or a plurality of color materials forming a color filter corresponding to pixels formed on the counter substrate 912 may be disposed so as to overlap the light-receiving opening 990-1. Then, a sensitivity spectroscopic property and the spectroscopic property of the light-receiving sensor 350P-1 may be made more equal to each other. For example, when a color filter corresponding to green pixels overlaps the light-receiving opening 990-1, a short wavelength and a long wavelength are cut. Accordingly, even when the spectroscopic property of the light-receiving sensor 350P-1 has a shorter wavelength or a longer wavelength than the sensitivity spectroscopic property, the wavelength can be corrected. In addition, an anti-reflection film, an interference layer, a polarizing layer, or the like can be made to overlap the light-receiving opening 990-1 in accordance with a certain purpose. Although not shown in FIG. 9, the top polarizing plate 924 may be made to overlap the light-receiving opening 990-1 or may be removed. If the top polarizing plate 924 is made to overlap the light-receiving opening 990-1, the light-receiving opening 990-1 cannot be seen. However, if the top polarizing plate 924 is removed, optical sensitivity is improved.

In the first embodiment, the liquid crystal display device 910 performs common electrode inversion driving (common AC driving) for applying an inversion signal to the common potential wiring line 335 in order to achieve low power supply consumption. Accordingly, an AC signal with an amplitude in the range of 0 to 5 V and a frequency of 14 KHz is supplied to the counter electrode 930. However, the transparent electrode 612P-1 is shielded from electromagnetic waves occurring in the counter electrode 930. Accordingly, when the counter electrode 930 is inversed, little noise occurs in the light-receiving sensor 350P-1. Likewise, the backlight light-shielded electrode 611P-1 has a function of shielding the lower portion from electromagnetic noise.

Figure 10:
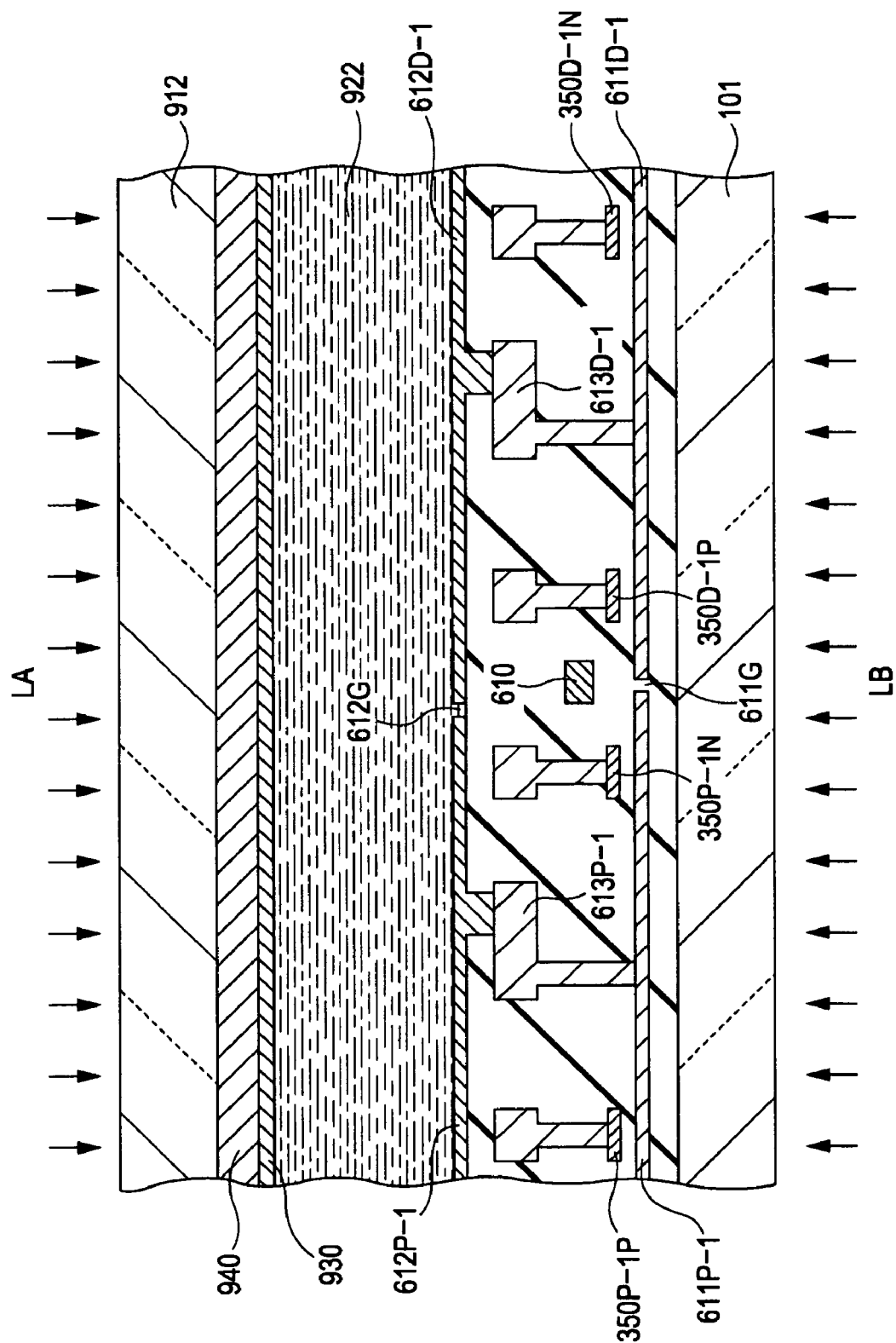
FIG. 10 is a sectional view taken along the line X-X shown in FIG. 8.

FIG. 10 is a sectional view illustrating a part of the liquid crystal display device 910 taken along the line X-X shown in FIG. 8. The backlight light-shielded electrode 611P-1 (first light-shielded electrode) and the backlight light-shielded electrode 611D-1 (second light-shielded electrode) formed on the ground insulating film are spaced from each other by a light-shielding electrode gap 611G. In addition, a potential is supplied to each of the backlight light-shielded electrode 611P-1 and the backlight light-shielded electrode 611D-1. The transparent electrode 612P-1 (first transparent electrode) and the transparent electrode 612D-1 (second transparent electrode) formed on the planarized insulating film are spaced from each other by a transparent electrode gap 612G. In addition, a potential is supplied to each of the transparent electrode 612P-1 and the transparent electrode 612D-1. The backlight light-shielded electrode 611P-1 and the transparent electrode 612P-1 are connected to each other through an intermediate electrode 613P-1, the gate insulating film, and the contact hole formed on the interlayer insulating film and the planarized insulating film. In addition, the backlight light-shielded electrode 611P-1 and the transparent electrode 612P- are connected to the wiring line PBT. The backlight light-shielded electrode 611D-1 and the transparent electrode 612D-1 are connected to each other through an intermediate electrode 613D-1, the gate insulating film, and the contact hole formed on the interlayer insulating film and the planarized insulating film. In addition, the backlight light-shielded electrode 611P-1 and the transparent electrode 612D-1 are connected to the wiring line DBT.

The light-shielding electrode gap 611G and the transparent electrode gap 612G do not overlap each other in a vertical direction of the active matrix substrate 101 and the counter substrate 912. With such a configuration, there is no region which is not shielded in the upper and lower portions in plan view. Since it is difficult for electromagnetic noise originating from the gaps to spread in the right and left directions, it is possible to reduce the deterioration of the shielding function due to the gaps.

A gap light-shielding member 610 made of molybdenum (Mo) thin film is formed to overlap the light-shielding electrode gap 611G. With such a configuration, the backlight light entering from the light-shielding electrode gap 611G becomes multiply-reflected from interfaces such as various insulating layers or glass and becomes stray light. Accordingly, it is possible to considerably reduce the proportion of backlight light reaching the light-receiving sensor 350P-1 or the light-shielded sensor 350D-1.

Figure 11:
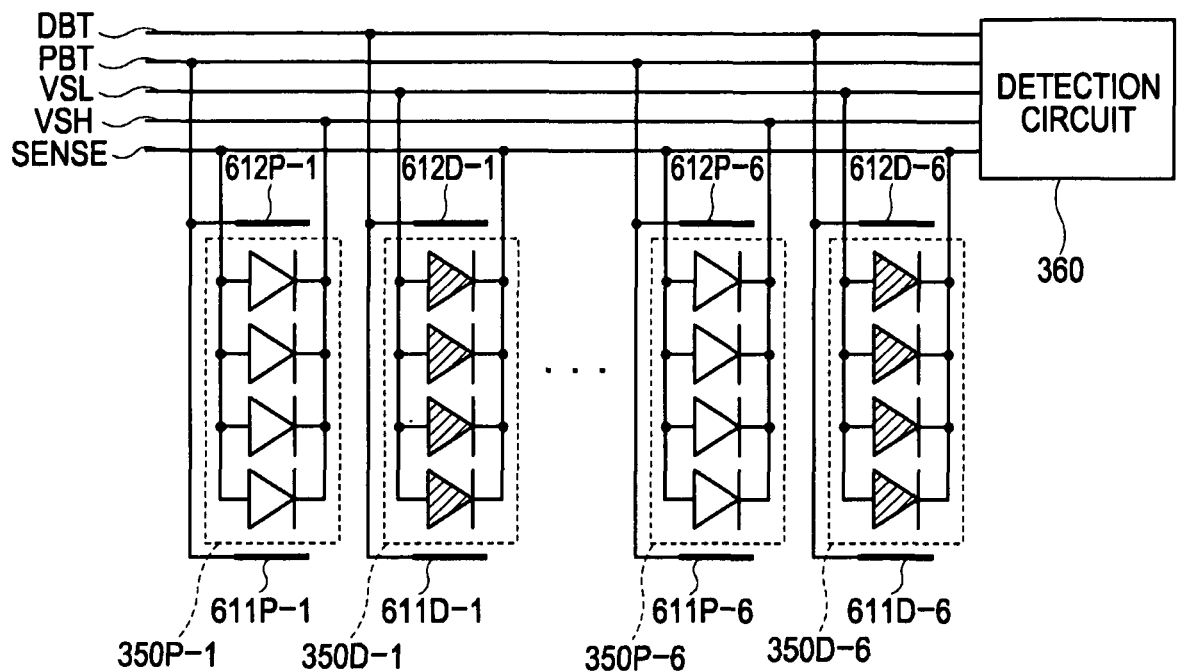
FIG. 11 is a diagram illustrating an equivalent circuit of the light-receiving sensor and the light-shielded sensor according to the first embodiment of the invention.
Figure 12:
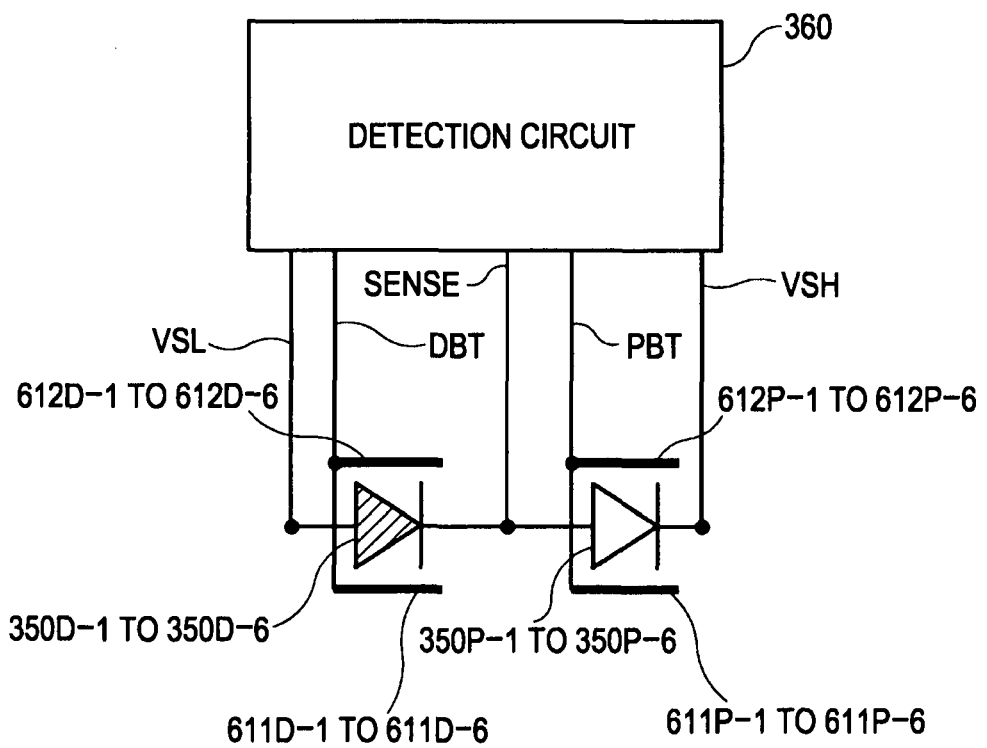
FIG. 12 is a diagram illustrating a simplified equivalent circuit of the light-receiving sensor and the light-shielded sensor according the first embodiment of the invention.

FIG. 11 is a diagram illustrating an equivalent circuit of the light-receiving sensors 350P-1 to 350P-6 and the light-shielded sensors 350D-1 to 350D-6 according to the above-described configuration. The light-receiving sensors 350P-1 to 350P-6 and the light-shielded sensors 350D-1 to 350D-6 each have four PIN diodes connected in parallel to each other. Moreover, the light-receiving sensors 350P-1 to 350P-6 are connected in parallel to each other and the light-shielded sensors 350D-1 to 350D-6 are also connected in parallel to each other. Accordingly, FIG. 11 shows the equivalent circuit to a circuit shown in FIG. 12. That is, each of the light-shielded sensors 350D-1 to 350D-6 is a PIN diode with a channel width of 24000 μm and a channel length of 10 μm. In addition, the anodes and the cathodes thereof are connected to the wiring line VSL and the wiring line SENSE, respectively. The backlight light-shielded electrodes 611D-1 to 611D-6 and the transparent electrodes 612D-1 to 612D-6, which overlap the light-shielded sensors 350D-1 to 350D-6 in plan view, are connected to the wiring line DBT. Each of the light-receiving sensors 350P-1 to 350P-6 is a PIN diode with a channel width of 24000 μm and a channel length of 10 μm. In addition, the anodes and the cathodes thereof are connected to the wiring line SENSE and the wiring line VSH, respectively. The backlight light-shielded electrodes 611P-1 to 611P-6 and the transparent electrodes 612P-1 to 612P-6, which overlap the light-receiving sensors 350P-1 to 350P-6 in plan view, are connected to the wiring line PBT.

Figure 13:
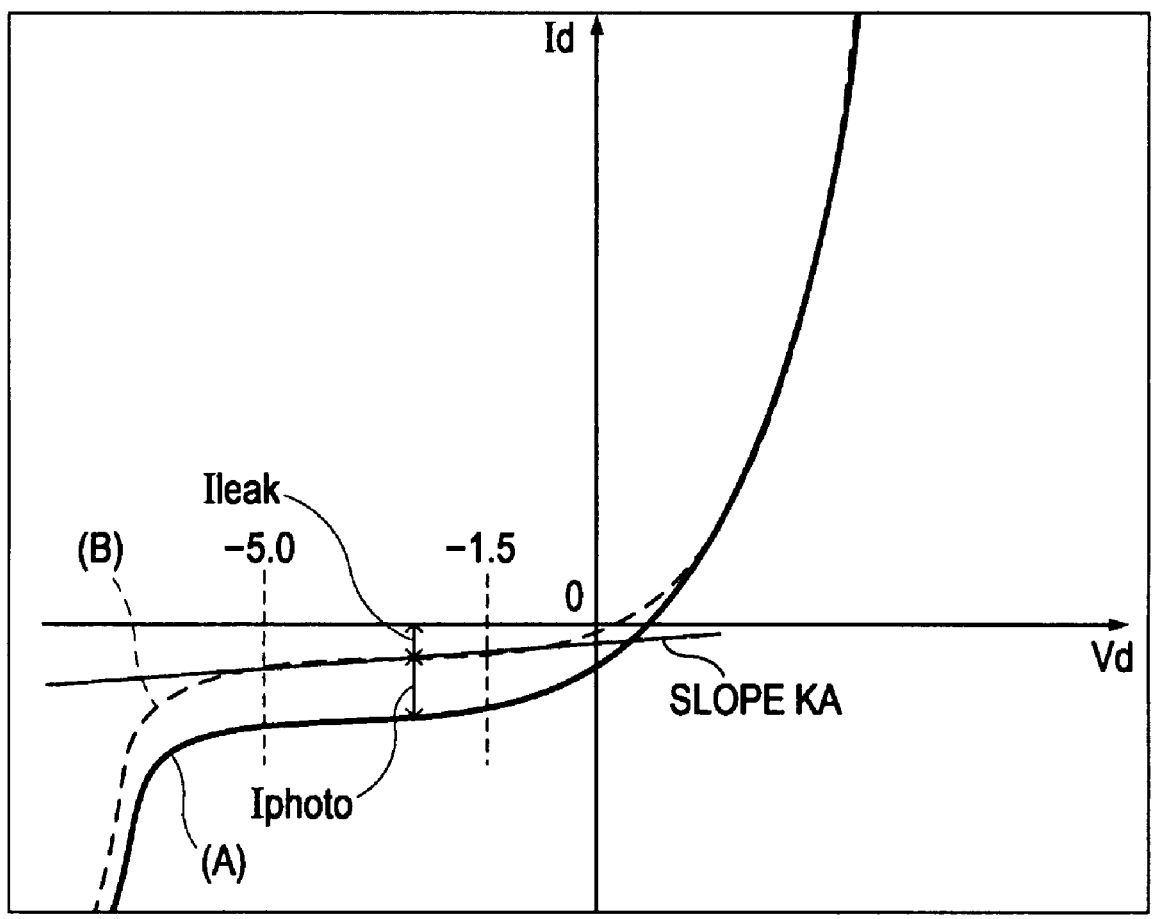
FIG. 13 is a curve showing the property of a PIN diode constituting the light-receiving sensor and the light-shielded sensor according to the first embodiment of the invention.

FIG. 13 is a curve showing the property of the PIN diodes constituting the light-receiving sensors 350P-1 to 350P-6 and the light-shielded sensors 350D-1 to 350D-6 when the external light having the illuminance LX radiates to the liquid crystal display device 910. A horizontal axis and a vertical axis denote a bias potential Vd (=anode potential–cathode potential) and a current Id flowing between the anode and the cathode, respectively. A curve (A) shown as a solid line is a characteristic of the light-receiving sensors 350P-1 to 350P-6 and a curve (B) shown as a dashed line is a characteristic of the light-shielded sensors 350D-1 to 350D-6. The curves (A) and (B) are almost the same in a bias region (Id>0), but the absolute value of the curve (B) of the light-receiving sensors 350P-1 to 350P-6 is larger in a reverse bias region (Id<0). That is because only a thermoelectric current Ileak caused by temperature flows in the light-receiving sensors 350D-1 to 350D-6 since the external light does not reach the sensors, however, a photoelectric current and a thermoelectric current, Iphoto+Ileak, flow in the light-receiving sensors 350P-1 to 350P-6 since light reaches the light-receiving portions 350P-1I to 350P-6I of the PIN diodes constituting the light-receiving sensors 350P-1 to 350P-6, thus a pair of carriers are generated, and the photoelectric current Iphoto flows. The thermoelectric current Ileak shows Vd (=anode potential–cathode potential) dependency and approximates to a linear line of a slope KA (KA>0) in the range of $-5.0 \leqq Vd \leqq -1.5$. Here, KA is a function of temperature; when temperature increases, KA increases exponentially. The photoelectric current Iphoto flowing in the light-receiving sensors 350P-1 to 350P-6 is almost constant in the Vd region (Vd=$-5.0 \leqq Vd \leqq -1.5$) and is proportional to the illuminance LX of the external light (hereinafter, referred to as Iphoto=LX×k). Accordingly, the current (curve (A)) flowing in the light-receiving sensors 350P-1 to 350P-6 and the current (curve (B)) flowing in the light-shielded sensors 350D-1 to 350D-6 have a linear line with a slope KA (KA>0) in the range of $-0.5 \leqq Vd \leqq -1.5$.

When a bias is set so that Vd of the light-shielded sensors 350D-1 to 350D-6 and Vd of the light-receiving sensors 350P-1 to 350P-6 are equal to each other, that is, a potential VSENSE of the wiring line SENSE is set to be a value ((VVSH+VVSL)÷2) between a potential VVSH of the wiring line VSH and a potential VVSL of the wiring line VSL, the thermoelectric current of the light-receiving sensors 350P-1 to 350P-6 is completely equal to that of the light-shielded sensors 350D-1 to 350D-6. At this time, the current (=the current flowing in the light-receiving sensors 350P-1 to 350P-6) flowing in the wiring line VSH is Iphoto+Ileak and the current (=the current flowing in the light-shielded sensors 350D-1 to 350D-6) flowing in the wiring line is Ileak. Accordingly, the current flowing in the wiring line SENSE is Iphoto=LX×k on the basis of Kirchhoff's first law and is proportional to the illuminance LX of the external light. In the first embodiment, the light-receiving sensors are connected to a high potential and the light-shielded sensors are connected to a low potential, but may be separately connected. The result is the same.

Figure 14:
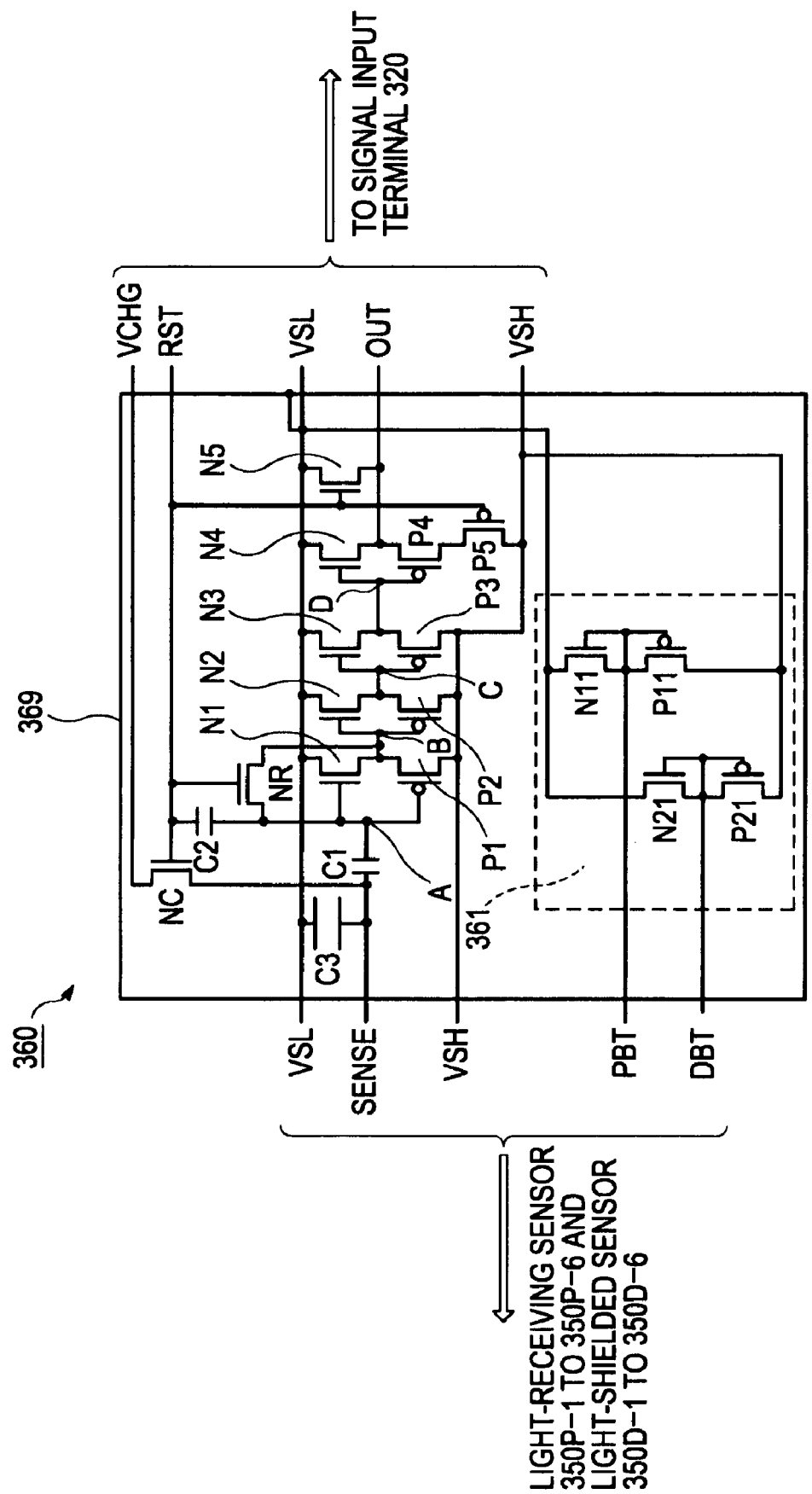
FIG. 14 is a diagram illustrating a detection circuit according to the first embodiment of the invention.

FIG. 14 is a diagram illustrating a detection circuit 360. A wiring line VCHG, a wiring line RST, the wiring VSL, the wiring VSH, and a wiring line OUT are connected to the signal input terminal 320. In addition, the wiring VSL, the wiring line VSH, the wiring line SENSE, the wiring line PBT, and the wiring line DBT are connected to the light-receiving sensors 350P-1 to 350P-6 and the light-shielded sensors 350D-1 to 350D-6. Here, the wiring line VCHG, the wiring line VSL, and the wiring line VSH are connected to a DC power supply supplied from the external power supply circuit 784. In addition, a potential VVCHG (=2.0 V) a potential VVSL (=0.0 V), and a potential VVSH (=5.0 V) are supplied to the wiring line VVCHG, the wiring line VCHG and the wiring line VSL, respectively. The potential VVSL of the wiring line VSL is GND of the liquid crystal display device 910.

The wiring line SENSE is connected to one end of a first capacitor C1 and one end of a third capacitor C3. In addition, the wiring line SENSE is connected to a grain electrode of an initial charging transistor NC. The other end of the third capacitor C3 is connected to the wiring line VSL. The other end of the first capacitor C1 is connected to a node A. A source electrode of the initial charging transistor NC is connected to the wiring line VCHG and is supplied with a potential VVCHG (=2.0 V). The gate electrode of the initial charging transistor NC is connected to the wiring line RST. The node A is connected to the gate electrode of a first N type transistor N1, a gate electrode of a first P type transistor P1, a grain electrode of a reset transistor NR. Moreover, the node A is connected to the other end of a second capacitor C2. The other end of the second capacitor C2 is connected to the wiring line RST.

A drain electrode of a first N type transistor N1, a drain electrode of the first P type transistor P1, and a source electrode of the reset transistor NR are connected to a node B. The node B is also connected to a gate electrode of a second N type transistor N2 and a gate electrode of a second P type transistor P2. A drain electrode of the second N type transistor N2 and a drain electrode of the second P type transistor P2 are connected to a node C. The node C is also connected to a gate electrode of a third N type transistor N3 and a gate electrode of a third P type transistor P3. A drain electrode of the third N type transistor N3 and a drain electrode of the third P type transistor P3 are connected to a node D. The node D is also connected to a gate electrode of a fourth N type transistor N4 and a gate electrode of a fourth P type transistor P4. A drain electrode of the fourth N type transistor N4 and a drain electrode of the fourth P type transistor P4 are connected to the wiring line OUT. The wiring line OUT is also connected to a drain electrode of a fifth N type transistor N5. A gate electrode of the fifth N type transistor N5 and a gate electrode of a fifth P type transistor P5 are connected to the wiring line RST. A drain electrode of the fifth P type transistor P5 is connected to a source electrode of the fourth P type transistor P4. Source electrodes of the first N type transistor N1 to the fifth N type transistor N5 are connected to the wiring line VSL and is supplied with the potential VVSL (=0.0 V). In addition, source electrodes of the first P type transistor P1 to the third P type transistor P3 and a source electrode of the fifth P type transistor P5 are connected to the wiring line VSH and is supplied with the potential VVSH (=+5 V).

The detection circuit 360 also includes a self-correction voltage circuit 361 which automatically corrects a potential applied to the wiring lines PBT and DBT on the basis of a threshold voltage (Vth) of a transistor. In the self-correction voltage circuit 361, a drain electrode and a gate electrode of a sixth N type transistor N11 are connected to the wiring line PBT, and a drain electrode and a gate electrode of a sixth P type transistor P11 are also connected to the wiring line PBT. A drain electrode and a gate electrode of a seventh N type transistor N21 are connected to the wiring line DBT and a drain electrode and a gate electrode of a seventh P type transistor P21 are connected to the wiring line DBT. Source electrodes of the sixth N type transistor N11 and the seventh N type transistor N21 are connected to the wiring line VSL and is supplied with the potential VVSL (=0 V). In addition, source electrodes of the sixth P type transistor P11 and the seventh P type transistor P21 are connected to the wiring line VSH and is supplied with the potential VVSH (=+5 V).

The entire detection circuit 360 is covered with a shield electrode 369 formed of the indium tin oxide (ITO) thin film, which forms the pixel electrode 402-n-m. The shield electrode 369, which is connected to the GND potential of the liquid crystal display device 910 through the wiring line VSL, serves as a shield from the electronic noise.

In the first embodiment, the channel width of the first N type transistor N1 is 10 μm, the channel width of the second N type transistor N2 35 μm, the channel width of the third N type transistor N3 100 μm, the channel width of the fourth N type transistor N4 150 μm, the channel width of the fifth N type transistor N5 150 μm, the channel width of the sixth N type transistor N11 4 μm, and the channel width of the seventh N type transistor N21 200 μm. The channel width of the first P type transistor P1 is 10 μm, the channel width of the second P type transistor P2 35 μm, the channel width of the third P type transistor P3 100 μm, the channel width of the fourth P type transistor P4 300 μm, the channel width of the fifth P type transistor P5 300 μm, the channel width of the sixth P type transistor P11 200 μm, and the channel width of the seventh P type transistor P21 4 μm. The channel width of the reset transistor NT is 2 μm and the channel width of the initial charging transistor NC is 50 μm. The channel length of all N type transistors is 8 μm and the channel length of all P type transistors is 6 μm. Mobility of all N type transistors is 80 cm/Vsec and mobility of all P type transistors is 60 cm/Vsec. A threshold voltage (Vth) of all N type transistors is +1.0 V and the threshold voltage (Vth) of all P type transistors is −1.0 V. Capacitance of the first capacitor C1 is 1 pF, capacitance of the second capacitor C2 is 100 pF, and capacitance of the third capacitor C3 is 100 pF.

The wiring line RST, which has a pulse wave with an potential amplitude in the range of 0 to 5 V, is driven by the image processing circuit 780 so that the wiring line RST of the High potential (5 V) is maintained for a pulse length of 100 μsec every period of 22.9 msec and the wiring line RST of the Low potential (0 V) for 22.8 msec. When the wiring line RST becomes High (5 V) every 22.9 msec, the initial charging transistor NC and the reset transistor NR are turned ON, the potential (2.0 v) of the wiring line VCHG is applied to the wiring line SENSE, and the nodes A and B are short-circuited. Since the first N type transistor N1 and the first P type transistor P1 constitute an inverter circuit, IN/OUT of the inverter circuit is short-circuited. At this time, the potential of the nodes A and B finally reaches a potential VS shown in the following expression (for detailed calculation, for example, see "CMOS Digital Integrated Circuits" by Kang Leblebici, third edition, P206 or the like).

$$VS = \frac{Vthn + \sqrt{\frac{WpLn\mu_p}{WnLp\mu_n}} \times (VVSH - VVSL + Vthp)}{\left(1 + \sqrt{\frac{WpLn\mu_p}{WnLp\mu_n}}\right)} \quad \text{[Expression 1]}$$

In this case, Wn refers to the channel width of the first N type transistor N1, Ln refers to the channel length of the first N type transistor N1, μn refers to the mobility of the first N type transistor N1, and Vthn refers to the threshold voltage of the first N type transistor N1. In addition, Wp refers to the channel width of the first P type transistor P1, Lp refers to the channel length of the first P type transistor P1, μp refers to the mobility of the first P type transistor P1, and Vthp refers to the threshold voltage of the first P type transistor P1. In the first embodiment, VS=2.5 (V) is therefore calculated. While the wiring line RST is High (5 V), the fifth N type transistor N5 is in an ON state. In addition, while the fifth P type transistor P5 is in an OFF state, the wiring line OUT is 0 V.

When the wiring line RST becomes Low (0 V) after 100 μsecond, the rest transistor NR is turned OFF and the nodes A and B are electrically disconnected. At this time, the inverter circuit constituted by the first N type transistor N1 and the first P type transistor P1 outputs a potential higher than VS to the node B when the potential of the node A is lower than VS, and alternatively outputs a potential lower than VS when the potential of the node A is higher than VS. The second N type transistor N2 and the second P type transistor P2, and the third N type transistor N3 and the third P type transistor P3 constitute each inverter circuit, which likewise outputs the potential higher than VS when the potential of the input end is lower than VS and outputs the potential lower than VS when the potential of the input end is higher than VS. At this time, a difference between the potential of the output end and VS is larger than a difference between the potential of the input end and VS, so that the difference approaches to the potential VVSH (=+5 V) of the wiring line VSH or the potential VVSL (=0 v) of the wiring line VSL. As a result, when the potential of the node A is lower than VS, the potential of a node D becomes the potential VVSH (=+5 V) of the wiring line VSH, and alternatively when the potential of the node A is higher than VS, the potential of the node D becomes the potential VVSL (=0 V) of the wiring line VSL. The fourth N type transistor N4, the fifth N type transistor N5, the fourth P type transistor P4, and the fifth P type transistor P5 constitute an NOR circuit. During the period the potential of the wiring line RST is Low (0 V), Low (0 V) is output to the wiring line OUT when the node D is in High (+5 V) and High (+5 V) is output to the wiring line OUT when the node D is in Low (0 V). That is, during the period the potential of the wiring line RST is Low (0 V), the output for the wiring line OUT is Low (0 V) when the potential of the node A is lower than VS, and alternatively the output for the wiring line OUT is High (+5 V) when the potential of the node A is higher than VS).

As described above, the wiring line RST becomes Low (0 V), the reset transistor NR is turned OFF, and the nodes A and B are electrically disconnected. However, the potential of the node A and the wiring line RST simultaneously decreases due to coupling of the second capacitor C2. Here, when the capacitance CC1 (=1 pF) of the first capacitor C1 is sufficiently larger than the capacitance CC2 (=100 fF) of the second capacitor C2 and the capacitance (equal or less than 10 fF in the first embodiment) between the gate electrodes and the drain electrodes of the first N type transistor N1, the first P type transistor P1, and the reset transistor NR and when a product of writing impedance of the reset transistor NR and the capacitance of the first capacitor C1 is sufficiently larger than a period of time (100 nsec in the first embodiment) the potential of the wiring line RST decreases, the potential (hereinafter, referred to as VA(t)) of the node A with the wiring line being Low (0 V) (hereinafter, referred to as t=0) is calculated by the following expression.

$$VA(t=0) = VS - \frac{CC2}{CC1} \times (VVSH - VVSL)$$ [Expression 2]

In the first embodiment, VA (t=0)=2.0 V. At this time, the bias of the light-receiving sensor 350P-1 is Vd=−3.0 V and the bias of the light-shielded sensor 350D-1 is Vd=−2.0 V. As shown in FIG. 13, a difference of the thermoelectric current Ileak of the PIN diodes constituting the light-receiving sensor 350P-1 and the light-shielded sensor 350D-1 is expressed as KA×1.0. Accordingly, current with the current KA×1.0 plus the photoelectric current Iphoto corresponding to the external light radiating to the light-receiving sensor 350P-1 flows in the wiring line SENSE. In this case, when Iphoto is larger than KA, the current flowing in the wiring line SENSE can approximate only Iphoto, thereby eliminating contribution to the thermoelectric current. In the first embodiment, KA at 70° C., which is the upper limit of operational guarantee temperature, becomes equal to Iphoto at illuminance of 10 lux. Accordingly, if the illuminance of the external light is equal or more than 100 lux, thermo-leak can be effectively eliminated within the range of the operational guarantee.

As the relation between the external light and Iphoto is described above, the bias condition is Iphoto=LX·k (where k is a constant coefficient) in proportion to the illuminance LX of the external light radiating to the light-receiving sensor 350P-1 without dependence on Vd. When the wiring line RST becomes Low (0 V), the node A is in the floating state. Accordingly, when the capacitance CC2 of the second capacitor C2 and the capacitance between the gates and the sources of the first N type transistor N1 and the first P type transistor P1 is not regarded, nearly effective capacitance is just the capacitance CC3 of the third capacitor C3. Therefore, the potential VSENSE of the wiring line SENSE varies as following expression.

$$VSENSE(t) = VVCHG + \frac{LX \times k}{CC3} + t$$ [Expression 3]

Additional capacitance of the light-receiving sensor 350P-1, the light-shielded sensor 350D-1, and a drawn wiring line is not considered for a convenient description. The additional capacitance is added to the CC3. When the additional capacitance of the light-receiving sensor 350P-1, the light-shielded sensor 350D-1, and a drawn wiring line is sufficiently large, the third capacitor C3 may be removed. Accordingly, the lowest limit of a CC3 value is determined from the additional capacitance of the light-receiving sensor 350P-1, the light-shielded sensor 350D-1, and a drawn wiring line.

VA(t) varies by the same potential due to the capacitance coupling as VSENSE(t) varies. Accordingly, the potential VA of the node A is expressed as follows.

$$VA(t) = VS - \frac{CC2}{CC1} \times (VVSH - VVSL) + \frac{LX \times k}{CC3} \times t$$ [Expression 4]

In this case, time t0 satisfying VA(t)=VS is expressed as follows.

$$t0 = \frac{CC2 \times CC3}{CC1 \times LX \times k} \times (VVSH - VVSL)$$ [Expression 5]

That is, an OUT output at time t0 is converted from Low (0 V) into High (5 V) and the illuminance LX of the external light can be easily calculated by time t0.

During the period the wiring line RST is in Low (0 V), the node A become the floating state. If the electronic noise enters at this state, the detection circuit 360 erroneously operates. Accordingly, it is important to prevent the electronic noise, and thus the shield electrode 369 is disposed.

However, the PIN diode or a PN diode with the lateral structure in the first embodiment have a problem in that the photoelectric current Iphoto for electric field in a vertical direction may vary. In the first embodiment, the potential (hereinafter, referred to as VPBT) of the transparent electrodes 612P-1 to 612P-6 and the backlight light-shielded electrodes 611P-1 to 611P-6 connected to the wiring line PBT has an effect on the property of the light-receiving sensors 350P-1 to 350P-6. In addition, the potential (hereinafter, referred to as VDBT) of the transparent electrode 612D-1 to 612D-6 and the backlight light-shielded electrodes 611P-1 to 611P-6 connected to the wiring line DBT has an effect on the property of the light-shielded sensors 350D-1 to 350D-6. The optimal potential of VPBT and VDBT depends on products due to manufacturing deviation, but has a strong correlation with the threshold value (Vth) of the thin-film transistor. In the first embodiment, the self-correction voltage circuit 361 capable of applying the potential VPBT and the potential VDBT in which voltages are self-corrected to the wiring lines PBT and DBT, respectively, on the basis of the threshold value (Vth) of the thin-film transistor is used. In the first embodiment, average values of the manufacturing deviation is VthN=+1.0 and VthP=−1.0 and the self-correction voltage circuit 361 applies 3.6 v and 1.4 V to the wiring lines PBT and DBT, respectively. Since the cathodes are connected to wiring line VSH in the light-receiving sensors 350P-1 to 350P-6 and the voltage thereof is 5.0 V, a difference in the potential between the cathodes of the backlight light-shielded electrode 611P-1 to 611P-6 and the transparent electrodes 612P-1 to 612P-6 is −1.4 V, which is the optimal potential for obtaining the photoelectric current. A characteristic of the transistor depends on the property of the manufacturing deviation. For example, in a case of VthN=+1.5 and VthP=−0.5, 4.1 V is applied to the wiring line PBT and 1.9 V is applied to the wiring line DBT. Likewise, for example, in a case of VthN=+0.5 and VthP=−1.5, 3.1 V is applied to the wiring line PBT and 0.9 V is applied to the wiring line DBT. When the threshold value of the transistor varies in any case, the potential VPBT and the potential VDBT applied to the wiring lines PBT and DBT also vary. Accordingly, it is possible to obtain the almost most photoelectric current.

It has been described when the illuminance LX of the external light is fixed, but ambient light periodically blinks in the environment of glow discharge type fluorescent light or the like. The fluorescent light is sine waves. If the instant voltage is proportional to illuminance, the illuminance LX (t') which is a function of time t' is expressed as follows.

$$LX(t') = LX0 \times \left| SIN\left(2\pi \frac{t' + \Delta t}{TH}\right) \right|$$ [Expression 6]

In this case, TH refers to a power supply period, that is, 1/50 second or 1/60 second. In Expression 6, a waveform has a period of TH/2, that is, 1/100 second or 1/120 second. At this time, the reason the period does not become TH, but TH/2 is because the illuminance is the same even when the potential is positive or negative and because an two moments when the potential becomes zero exist (the moment when the positive becomes the negative and vice versa). Δt refers to a period of time from the moment when the power supply potential of the fluorescent light becomes zero and the illuminance becomes zero to the moment when a RST signal becomes Low (0 V) and the detection circuit 360 starts a detecting operation. In addition, Δt becomes a random value from 0 to TH/2.

In consideration of the change in the period of time, Expression 4 is modified as follows.

$$VA(t) = VS - \frac{CC2}{CC1} \times (VVSH - VVSL) + \frac{k \times LX0}{CC3} \int_0^t \left| SIN\left(2\pi \frac{t' + \Delta t}{TH}\right) \right| dt'$$ [Expression 7]

As known from Expression 7, a value of VA(t) varies in accordance with Δt. Accordingly, t0 in VA(t0)=VS depends on Δt, deviation randomly occurs, thereby resulting in reduction in precision. The smaller T0 becomes, the larger the reduction in precision becomes. Accordingly, the reduction in precision more occurs in a sensor having a better sensitivity. In order to prevent such reduction in precision, a plurality of measurement are performed to calculate an average of the measurement. However, when Δt=Δt0 is calculated in a first measurement is and a period of an RST signal refers to TR(time interval T1), Δt in a second detection is equal to Δt0 plus TR and a surplus of TH/2. That is, when TR is integer multiple (where the surplus is 0) of TH/2, Δt=Δt0 in the second measurement. In this way, when the period of the RST signal is the integer multiple of TH/2, the precision may deteriorate. Such a problem will be described with reference to FIGS. 15 and 16.

Figure 15A:
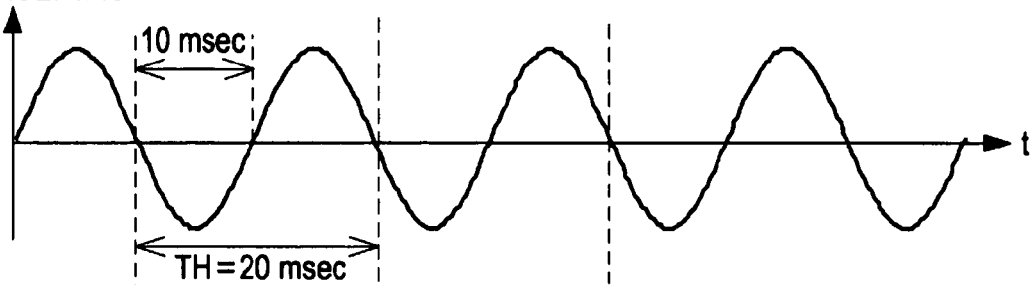
FIGS. 15A to 15D are timing charts for explaining known problems according to the invention.
Figure 15B:
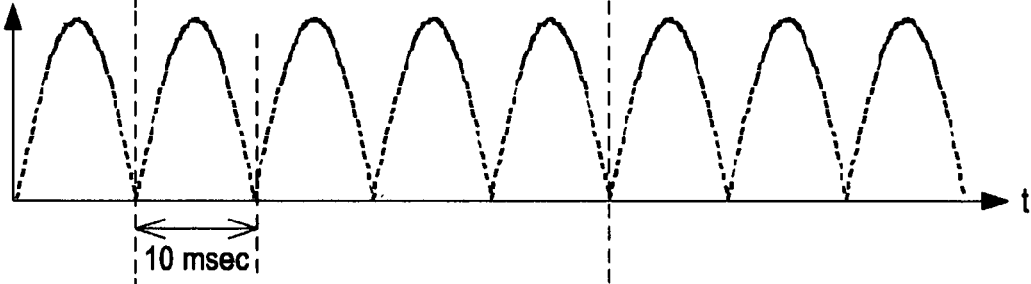
Figure 15C:
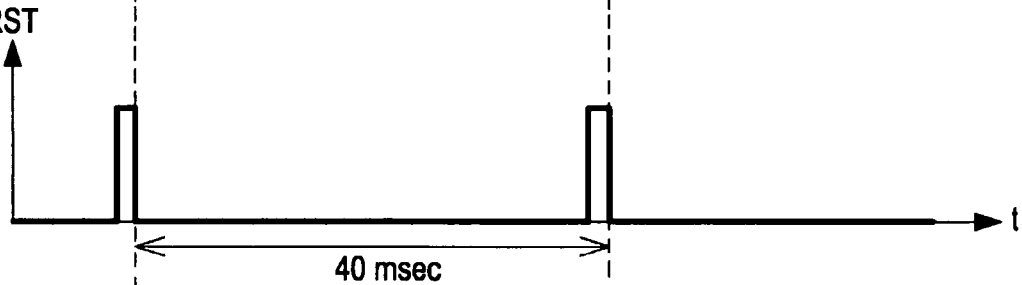
Figure 15D:
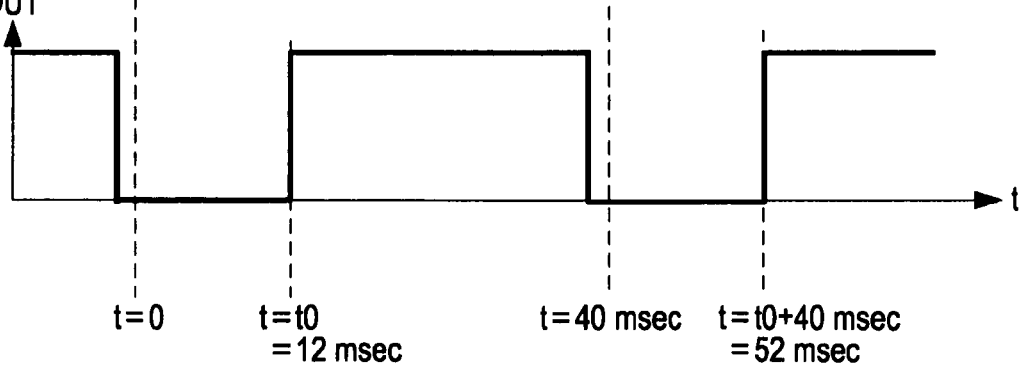
Figure 16A:
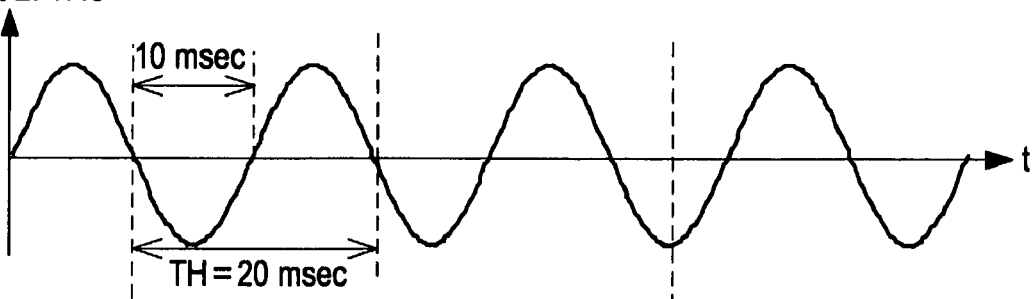
FIGS. 16A to 16D are timing charts for explaining known problems according to the invention.
Figure 16B:
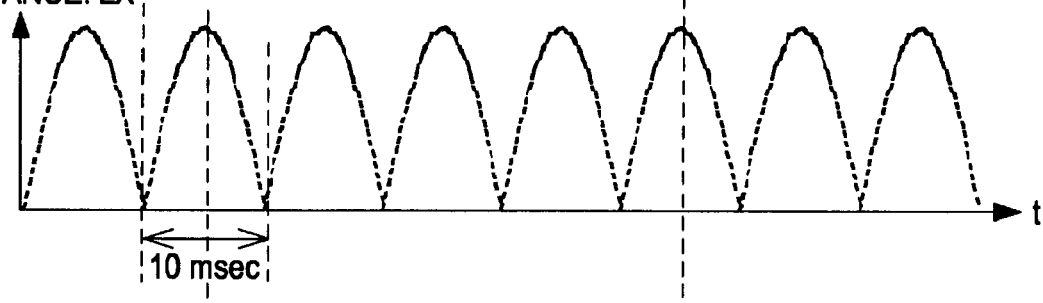
Figure 16C:
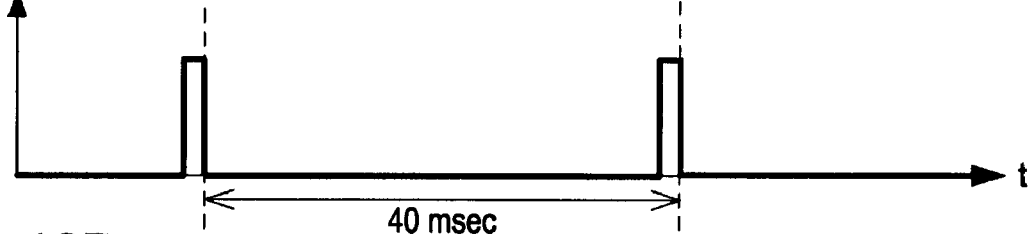
Figure 16D:
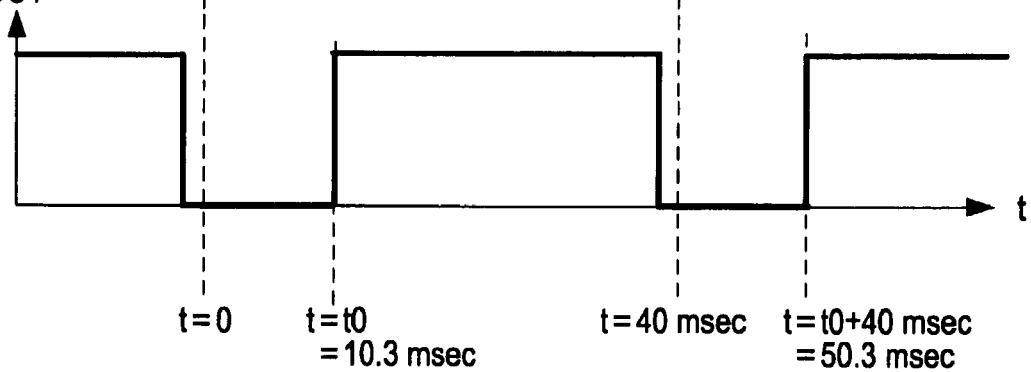
Figure 17A:
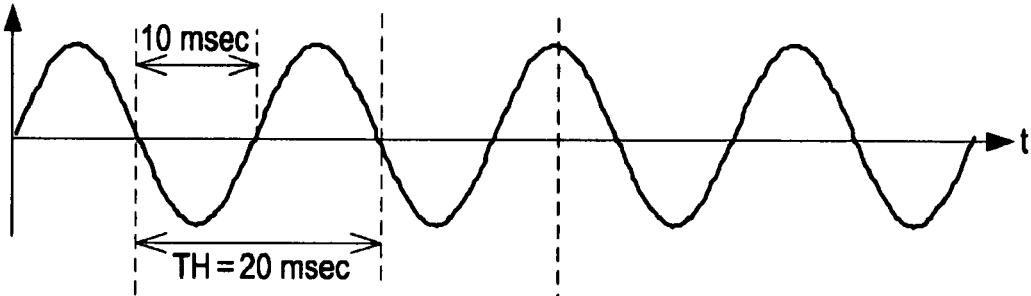
FIGS. 17A to 17D are timing charts for explaining advantages according to the invention.
Figure 17B:
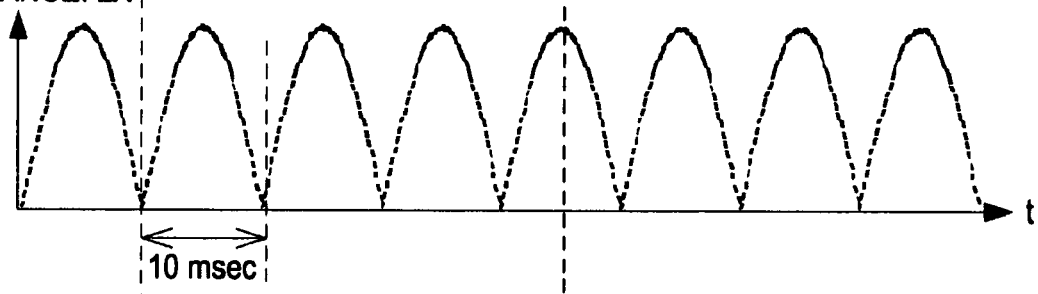
Figure 17C:
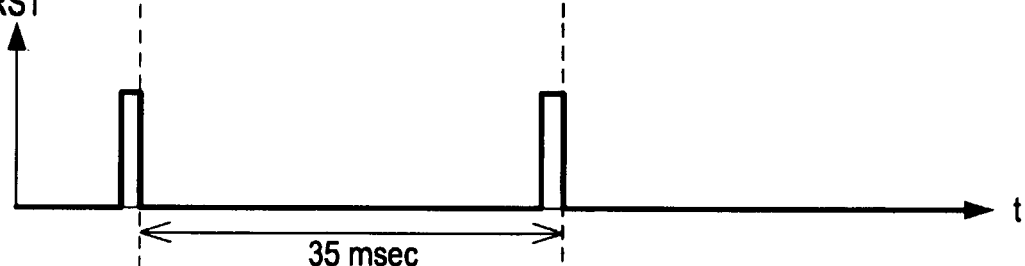
Figure 17D:
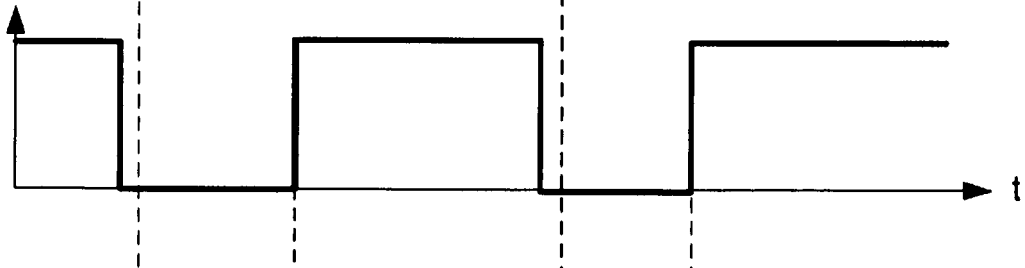

A curve shown in FIG. 15A is an AC power supply at power supply frequency of 50 Hz. The TH period is 20 msec. A curve shown in FIG. 15B is illuminance under glow type fluorescent light which blinks in a period of 10 msec. Another light is configured not to radiate to the liquid crystal display device 910 under the measurement environment. A curve shown in FIG. 15C is a signal potential of the wiring line RST. A signal period of the wiring line RST is configured to be TR=40 msec. First, the illuminance of the external light is 0 at timing when the RST signal is inverted from High (5 V) to Low (0 V) at t=0 (Δt=0). At this time, the potential of the wiring line OUT output from the detection circuit 360 at t=t0=12 msec is inverted. During the subsequent detection period of time, the RST signal is again inverted from High (5 V) to Low (0 V) at t=40 msec, but TR is the integer multiple (4 times) of TH/2. Accordingly, during the subsequent detection period of time, the potential of the wiring line OUT is inverted at t=t0+TR=52 second from the illuminance of 0 (Δt=0), that is, at the timing when the RST signal is inverted from High (5 V) to Low (0 V). As a result, the detection illuminance in the first measurement is the same as that in the second measurement, and afterward the result is the same in the several subsequent detection periods of time.

FIGS. 16A to 16D show the measurement result when a power supply is applied to an electronic apparatus under the same environment after the measurement in FIGS. 15A to 15D. The reference numerals are the same as those in FIGS. 15A to 15D. Since the power supply is re-applied to the electronic apparatus, timing is subtly changed. At this time, the illuminance LX of the external light becomes MAX (LX0) at the timing when the RST signal is inverted from High (5 V) to Low (0 V) (Δt=5 msec). Then, since the illuminance starts from the MAX state, integral current is quickly constant, compared with the timing shown in FIGS. 15A to 15D and the potential of the wiring line OUT is inverted more quickly than that shown in FIG. 15A to 15D, and thus inverted at t0=10.3 msec. Therefore, the illuminance increases by 17%, compared with the result measured in FIGS. 15A to 15D. TR is 40 msec, and thus since the same detection result is also obtained in a second measurement, the average obtained by performing the sampling several times is the same.

In this way, even though the condition of the external light is equal, the detection results at the time a switch is turned ON or OFF are different by 17%. The shorter the detection period of time (t0) is, the more considerable the deviation becomes. In particular, there are many cases where a display device is driven at a frame rate of 60 Hz. However, in order to simplify a configuration of a circuit (the image processing circuit 780 in the first embodiment) for generating signals, the signal of the wiring RST is generated by using a driving signal of the display device. At this time, TR may is a period of multiple of 1/60 second, thereby resulting in the above-described problem in a region of the AC power supply of 60 Hz.

In the above-described example, the period TR of RST is the integer multiple of TH/2. However, the period TR of RST is close to the integer multiple of TH/2, the detection result has a waveform with a long-term period. For example, when the TH=1/50 and the period TR of RST=1/101 second, the detection result is changed gently during a period of 1 second. Accordingly, unless the sampling is performed for 1 second or more, an exact average value cannot be calculated. Therefore, response of the sensor considerably deteriorates. In this way, the period TR of RST should not be set to be the integer multiple of 1/100 or 1/120 second or a value close thereto.

FIGS. 17A to 17D show an improved case where TR is an integer+0.5 times of TH/2. The reference numerals are the same as those in FIGS. 15A to 15D. In this case, TR is equal to 35 msec. When TH is 20 msec, there is no change. Accordingly, TR is set to be 3.5 times of TH/2. Likewise in FIGS. 15A to 15D, a measurement starts when the illuminance is equal to 0 at t=0. Accordingly, a first measurement result at t0 is equal to 12 msec. However, since TR is an integer+0.5 times of TH/2, a second measurement starts at the time the illuminance is MAX. Accordingly, in the second measurement, the detection time t0 is 10.3 second. When an average of twice measurements is calculated, the calculationally average deviation described in FIGS. 15A to 15D and FIGS. 16A to 16D can be suppressed to about 41%.

However, actually, time 1/50 second and time 1/60 second exist in TH. In addition, when TR is set to be an integer+0.5 times of TH/2 at all time, TR may lengthen. Therefore, a value of an integer+0.5 times in the range of 1/100 to 1/120 second can be set. In the first embodiment, a value of 2.5 times of 1/109 second, 22.9 msec, is used as TR. The calculational deviation can be suppressed to 51% at worst, compared with the case where TR is set to be an integer of TH/2 (for example, 20 msec).

Of course, in the case of a device used only in the region in which the power supply is 50 Hz or 60 Hz, an integer+0.5 times of 1/100 or 1/120 second can be used. In addition, the circuit may have two types of TRs and may be configured to be switched to the image processing circuit 780. At this time, the switch to the image processing circuit 780 may be performed by a user or may be automatically performed.

In the first embodiment, the central operational circuit 781 detects the signal of a terminal OUT and obtains a discrete V10 form the inverted time t0. The discrete value V10 is sampled twice to obtain an average V10_. An appropriate voltage setting value VV2 of the backlight unit 926 corresponding to the V10_ is obtained with reference to the reference table 785. The central operational circuit 781 supplies the V20 to the external power supply circuit 784 to modify the brightness of the backlight unit 926. In this way, it is possible to improve visibility and suppress power consumption by changing the brightness at the time the liquid crystal display device 910 exhibits white display and by suppressing the surplus brightness for a user. The number of the sampling may not be twice, and as long as the number is even, the number of the sampling is permitted.

The signal of the wiring line RST is given from the image processing circuit 780. However, since a frame rate of the liquid crystal display device 910 is equal to the signal period of the wiring line RST, the signal of the wiring line RST can be easily generated from a base clock equal to that used to generate the driving signal of the scanning line driving circuit 301 or the data line driving circuit 302. Accordingly, it is possible to reduce cost without an increase in the size of the circuit for generating the signal of the wiring line RST.

Figure 18:
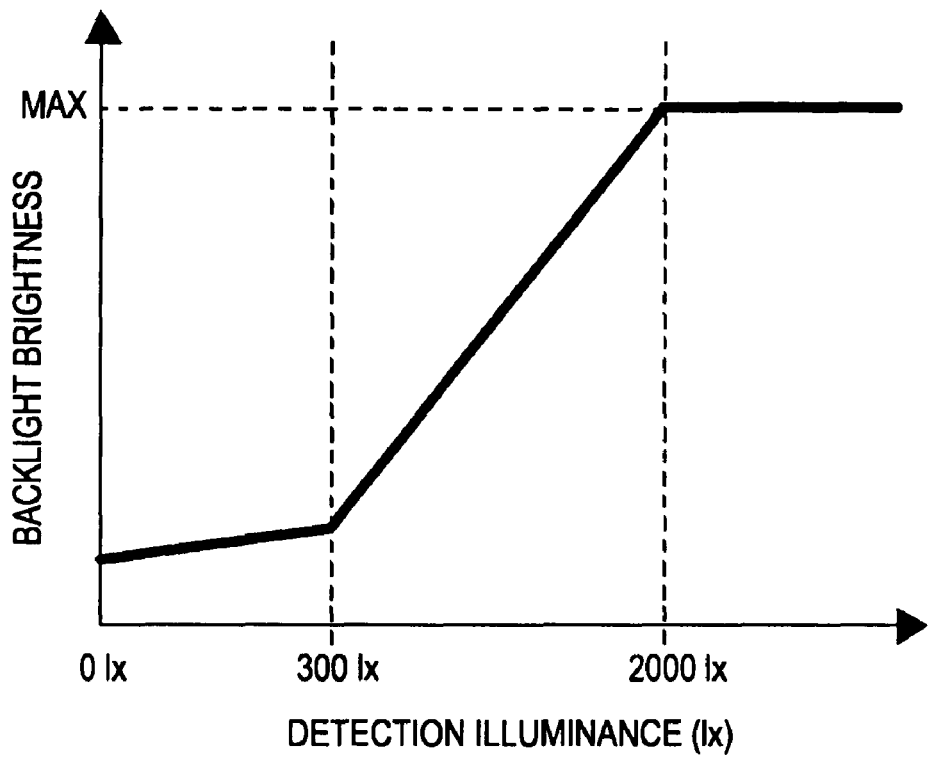
FIG. 18 is a diagram illustrating a relationship between detection illuminance of external light and brightness of a backlight according to the first embodiment of the invention.

In the first embodiment, relationship between the detection illuminance of the external light and the brightness of the backlight is set in FIG. 18. The brightness of the backlight gradually increases until detection illuminance of 300 lux. In addition, the illuminance of the backlight increases relatively steeply from 300 lux. The brightness becomes MAX from the detection illuminance of 2000 lux, and afterward is in the same state. With such a configuration, the surroundings are considerably dark at 300 lux or less and when a pupil of a user becomes large, the backlight is suppressed to the extent of no glaring state. In the range in which the external light from 300 lux to 2000 lux radiates to the liquid crystal panel, the visibility cannot deteriorate by raising the brightness in accordance with the ambient light.

Figure 19:
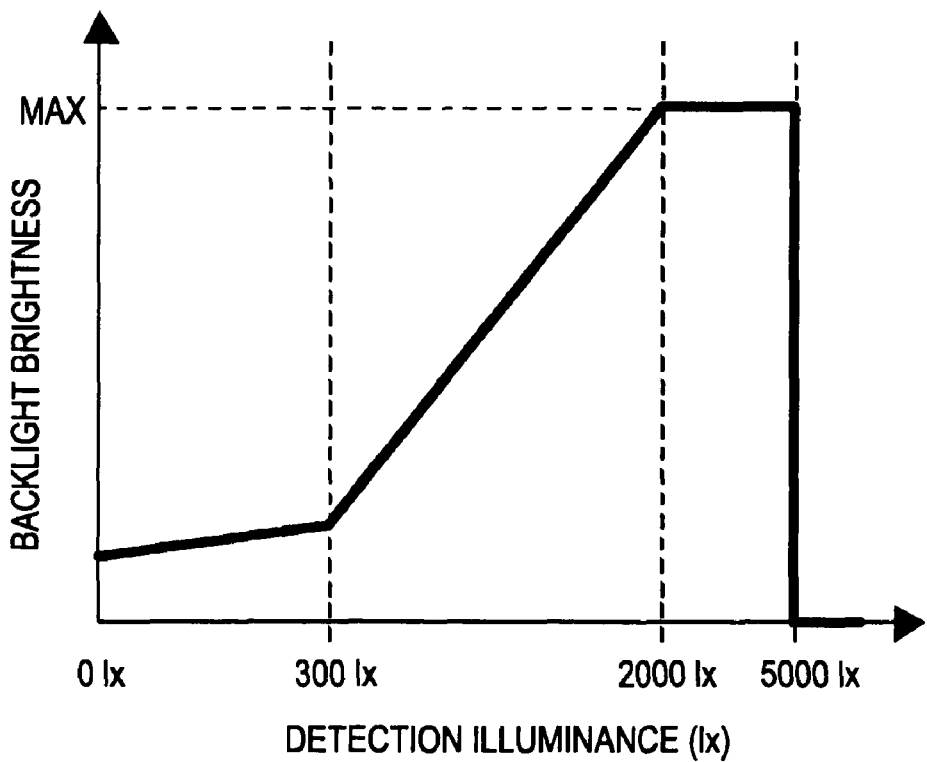
FIG. 19 is a diagram illustrating another relationship between the detection illuminance of the external light and the brightness of the backlight for a transflective liquid crystal display device.

Alternatively, when the transmissive type in the first embodiment is not used, but a transflective liquid crystal type is used, the relationship between the detection illuminance and the brightness is set in FIG. 19. The same is applied until the outside illuminance of 5000 lux, but the visibility is sufficient only for a reflection portion at 5000 lux or more. Accordingly, the backlight can be turned OFF to save the power consumption, and thus it is possible to considerably increase a driving period of time when a battery mounted in an electronic apparatus can be used.

Of course, the curves shown in the curves are examples and any curve can be set in accordance with usages. Moreover, in order to prevent the blink, a hysteresis may be set in the curve. Alternatively, the brightness adjustment may not be necessary every measurement. A plurality of measurement may be performed to calculate an average or median value, instead.

Second Embodiment

Figure 20:
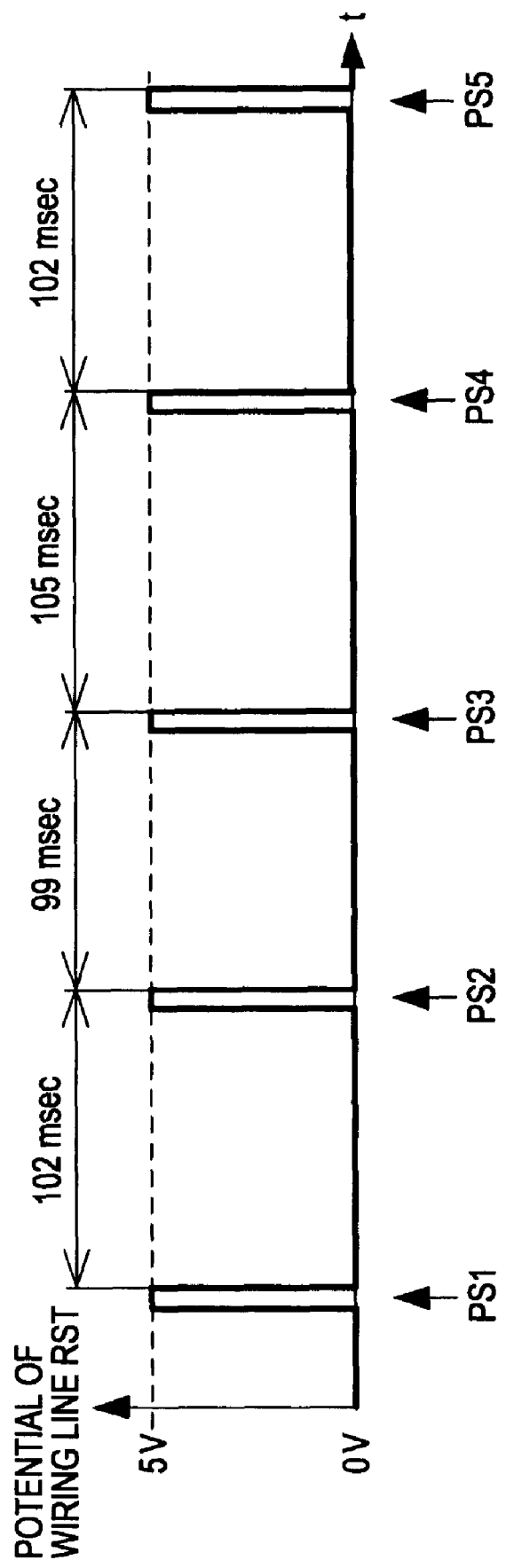
FIG. 20 is a diagram illustrating a timing chart of a signal potential of a wiring line RST according to a second embodiment of the invention.

FIG. 20 is a diagram illustrating a timing chart of a potential of a wiring line RST according to a second embodiment. Scale is not uniform in order to easily show the drawing. In the second embodiment, an interval between a pulse PS1 at which an RST signal becomes High (5 V) and a first detection period of time starts and a pulse PS2 in which a second detection period of time starts is 102 msec. Subsequently, an interval between the pulse PS2 and a pulse PS3 in which a third detection period of time starts is 99 msec. Subsequently, an interval between the pulse PS3 and a pulse PS4 in which a fourth detection period of time starts is 105 msec. Subsequently, an interval between the pulse PS4 and a pulse PS5 in which a fifth detection period of time starts is 102 msec. At a period of 306 msec, such an operation is reiterated.

A configuration of a liquid crystal display device 910 or an electronic apparatus is the same as that according to the first embodiment, and thus will be omitted.

In the second embodiment, a central operational circuit 781 which detects signals of a terminal OUT first obtains a discrete value V1 from an inversion time t0, obtains a discrete V2 from inversion time t0 in the subsequent detection period of time, and then obtains a discrete V3 from inversion time t0 in the subsequent detection period of time. At this time, V1, V2, and V3 are re-arranged in a value order, and then a value V1_ is obtained from an average of the largest value among V1, V2, and V3 and the smallest value among V1, V2, and V3. With reference to a reference table 785 from the value V1_, an appropriate voltage setting value VV2 of a backlight unit 926 corresponding to the value V1_ is obtained. The central operational circuit 781 supplies the value V2 to an external power supply circuit 784 so that brightness of the backlight unit 926 is changed.

In this way, the sampling is performed 3 times or more, changing the detection period of time a little. Then, two mutually close values are selected, one value is discarded (where the closest detection period of time may be equal to integer multiple of a blink period of external light), and then the average is calculated from the remaining values. In this way, it is possible to cope with the blink period of all external light.

With such a configuration, it is possible to perform a detection operation with good precision under a specific environment which is not limited to the case where the blink period of the external light is 1/100 second or 1/120 second. Specifically, in areas where power supply is not good, there may be a case where frequency of power supply is considerably out of 50 Hz or 60 Hz. In addition, in a special illuminator or the like, a blink period may not be 1/100 second or 1/120 second. However, even in such environment, in the second embodiment, it is possible to perform the measurement operation with a good precision.

Among the plurality of different detection period of time, a case where one thereof is not the integer multiple of 1/100 second or 1/120 second is appropriate, and furthermore it is desirable that all the detection periods of time are not the integer multiple of 1/100 second or 1/120 second. It is considered that the environment in which the blink period of the external light is 1/100 second or 1/120 second frequently occurs. Accordingly, it is desirable to avoid the integer multiple cases. In the second embodiment, the detection periods of time are therefore set as three types of 102 msec, 99 msec, and 105 msec.

In addition to the case where the plurality of detection periods of time are set in advance, a random detection period of time may be set. A random number generating circuit or a random number table may be used. Moreover, for example, if an electronic apparatus includes another sensor such as a vibration sensor, the measurement result or the like may be input to determine the detection period of time.

The above-described embodiments are all just examples, and thus the invention is not limited thereto. The scope of the invention is not defined by the forgoing embodiments, but by the claims of the invention. Moreover, all modifications within the meaning and scope of the claims of the invention are included.

The invention is not limited to the forgoing embodiments, but is applicable to a device which includes all types of a light sensor. In particular, effect is apparent in an electronic apparatus to be used outdoor.

The invention may be applied to a vertical alignment (VA) mode liquid crystal display device, an in-plane switching (IPS) mode liquid crystal display device using a transverse electric field, a fringe-field switching (FFS) mode liquid crystal display mode, or the like. The invention may be applied to a total-transmissive mode, a total-reflective mode, or a tranflective mode. The invention is applied to not only a liquid crystal display device, but also an organic EL display, a field emission type display. In addition, the invention is also applied to a semiconductor apparatus.

What is claimed is:

1. An electro-optical device comprising:
   a panel having a display area in which an electro-optical material is interposed between first and second substrates;
   a light detection unit disposed on the first or second substrate, the light detection unit including at least one light sensor to detect illuminance of ambient light of the pane; and
   a light shielding electrode positioned relative to the sensor to block at least a portion of light emitted from a backlight unit from reaching the light sensor,
   wherein the light detection unit performs a detecting operation plural times at a predetermined time interval, and
   wherein the predetermined time interval is set to be a value except for an integer multiple of about $1/100$ sec or about $1/120$ sec.

2. A semiconductor device comprising:
   a light sensor disposed on a substrate to measure illuminance of external light around the substrate;
   a light shielding electrode positioned relative to the light sensor to block at least a portion of light emitted from a backlight unit from reaching the light sensor; and
   a detection circuit connected to the light sensor to perform an output corresponding to the illuminance of the external light,
   wherein the detection circuit performs an operation of detecting the illuminance of the external light plural times on the basis of an input from the light sensor, and
   wherein T1 is a time interval between a first detecting operation and a second detecting operation subsequent to the first detecting operation, and the time interval T1 is set to be a value except for an integer multiple of about $1/100$ sec or about $1/120$ sec.

3. The semiconductor device according to claim 2, wherein the time interval T1 is set to be an (n+0.5) multiple of $1/100$ sec, an (n+0.5) multiple of $1/120$ sec, or a value therebetween, n being an integer greater than or equal to zero.

4. The semiconductor device according to claim 3, further comprising a circuit (central operational circuit) that samples the output of the detection circuit plural times to perform a statistical process.

5. The semiconductor device according to claim 2, wherein T2 is a time interval between the second detecting operation and a third detecting operation subsequent to the second detecting operation, and the time interval T1 and the time interval T2 are different from each other.

6. The semiconductor device according to claim 3,
   wherein T2 is a time interval between the second detecting operation and a third detecting operation subsequent to the second detecting operation, and the time interval T1 and the time interval T2 are different from each other.

7. The semiconductor device according to claim 2, wherein the light sensor is an element which converts the illuminance of the external light into current, and
   wherein the detection circuit is a circuit which resets one end of a node connected to the light sensor to an initial potential every start of a detection period and which performs the detecting operation by detecting a variation in a potential of the node.

8. The semiconductor device according to claim 3, wherein the light sensor is an element which converts the illuminance of the external light into current, and
   wherein the detection circuit is a circuit which resets one end of a node connected to the light sensor to an initial potential every start of a detection period and which performs the detecting operation by detecting a variation in a potential of the node.

9. The semiconductor device according to claim 2, wherein the light sensor is a PIN junction diode or a PN junction diode using a polysilicon thin film.

10. The semiconductor device according to claim 3, wherein the light sensor is a PIN junction diode or a PN junction diode using a polysilicon thin film.

11. A display device comprising the semiconductor device according to claim 2.

12. An electronic apparatus comprising the display device according to claim 11.

13. The display device according to claim 12, wherein the time interval T1 is an integer multiple of a frame period at which display is rewritten.

14. A method of detecting ambient light comprising:
   providing a panel having a display area in which an electro-optical material is interposed between first and second substrates; and
   detecting illuminance of ambient light of the panel with a light detection unit disposed on the first or second substrate by performing a detecting operation a plurality of times during a predetermined time interval,
   wherein the predetermined time interval is set to be a value except for an integer multiple of about $1/100$ sec or about $1/120$ sec.

* * * * *